United States Patent
Chou

(10) Patent No.: US 9,058,511 B2
(45) Date of Patent: Jun. 16, 2015

(54) BIOMETRICS SENSOR MODULE, ASSEMBLY, MANUFACTURING METHOD AND ELECTRONIC APPARATUS USING SUCH BIOMETRICS SENSOR MODULE

(71) Applicant: Bruce C. S. Chou, Hsin Chu (TW)

(72) Inventor: Bruce C. S. Chou, Hsin Chu (TW)

(73) Assignee: J-METRICS TECHNOLOGY CO., LTD., Taipei (TW)

( * ) Notice: Subject to any disclaimer, the term of this patent is extended or adjusted under 35 U.S.C. 154(b) by 2 days.

(21) Appl. No.: 14/082,530

(22) Filed: Nov. 18, 2013

(65) Prior Publication Data

US 2014/0140588 A1    May 22, 2014

(30) Foreign Application Priority Data

Nov. 21, 2012 (TW) ............................. 101143369 A

(51) Int. Cl.
*G06K 9/00* (2006.01)

(52) U.S. Cl.
CPC ................................... *G06K 9/0002* (2013.01)

(58) Field of Classification Search
CPC . G06F 21/32; G06F 2203/0338; G06F 21/83; G06F 3/03547; G06F 3/041; G06K 9/0002; G06K 9/00013

USPC ............ 382/124, 125, 126; 396/15; 340/5.53, 340/5.83

See application file for complete search history.

(56) References Cited

U.S. PATENT DOCUMENTS

| | | | |
|---|---|---|---|
| 7,894,643 B2 * | 2/2011 | Setlak et al. ................... | 382/124 |
| 2009/0257626 A1 * | 10/2009 | Sherlock et al. ............... | 382/126 |
| 2010/0117075 A1 * | 5/2010 | Akimoto et al. ................ | 257/43 |
| 2014/0009429 A1 * | 1/2014 | Verweg et al. ................ | 345/174 |

* cited by examiner

*Primary Examiner* — Mike Rahmjoo
(74) *Attorney, Agent, or Firm* — Muncy, Geissler, Olds & Lowe, P.C.

(57) ABSTRACT

A biometrics sensor module includes a housing, a biometrics sensor and a coupling electrode. The housing has a first surface and a second surface opposite to the first surface. The biometrics sensor has a sensing surface, which is disposed on the first surface of the housing and has sensing members arranged in an array. The coupling electrode is disposed on the first or second surface of the housing. Two regions, projected from the sensing surface and the coupling electrode to the second surface of the housing, do not overlap with each other. A coupling signal is provided to the coupling electrode and directly or indirectly couples the coupling signal to an object, so that the sensing members of the biometrics sensor sense biometrics messages of the object contacting with the second surface of the housing.

18 Claims, 25 Drawing Sheets

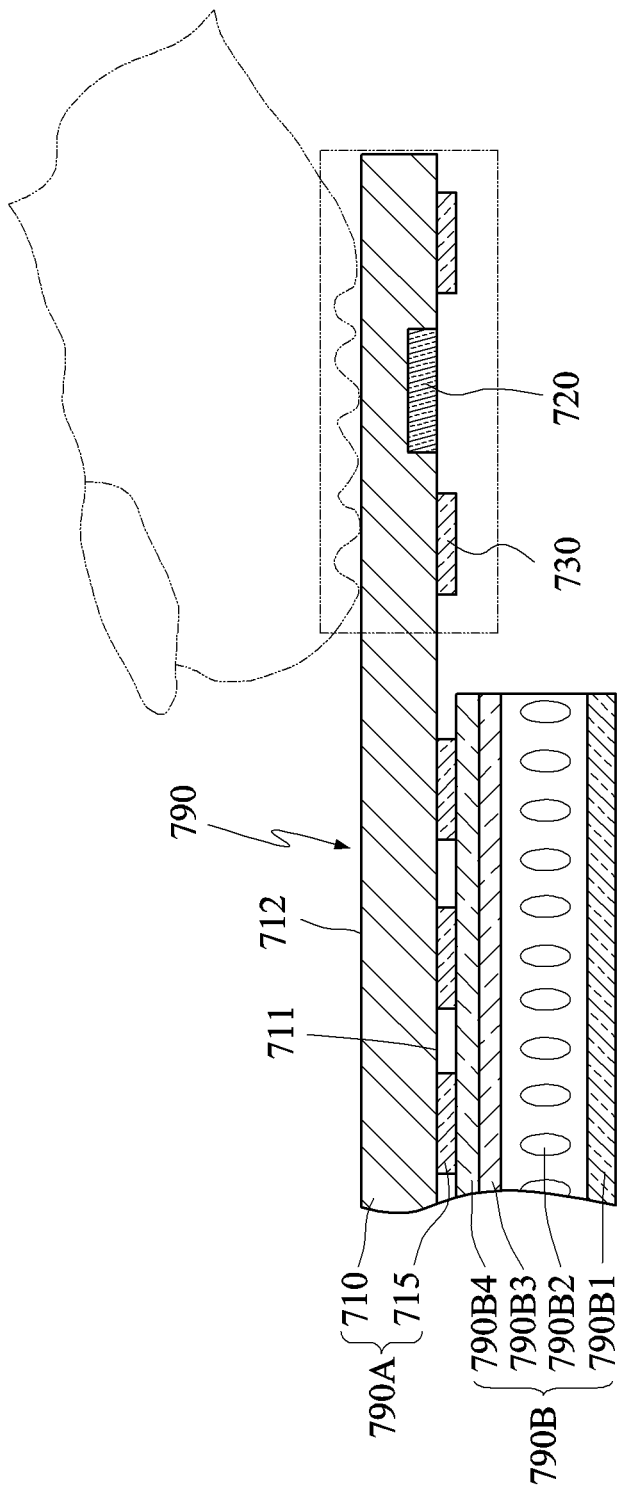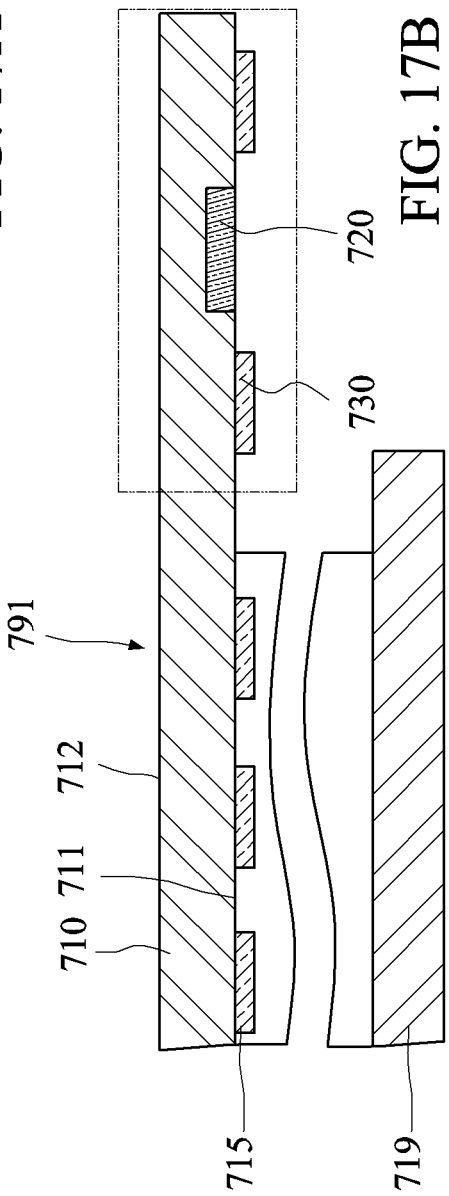
FIG. 17A
FIG. 17B

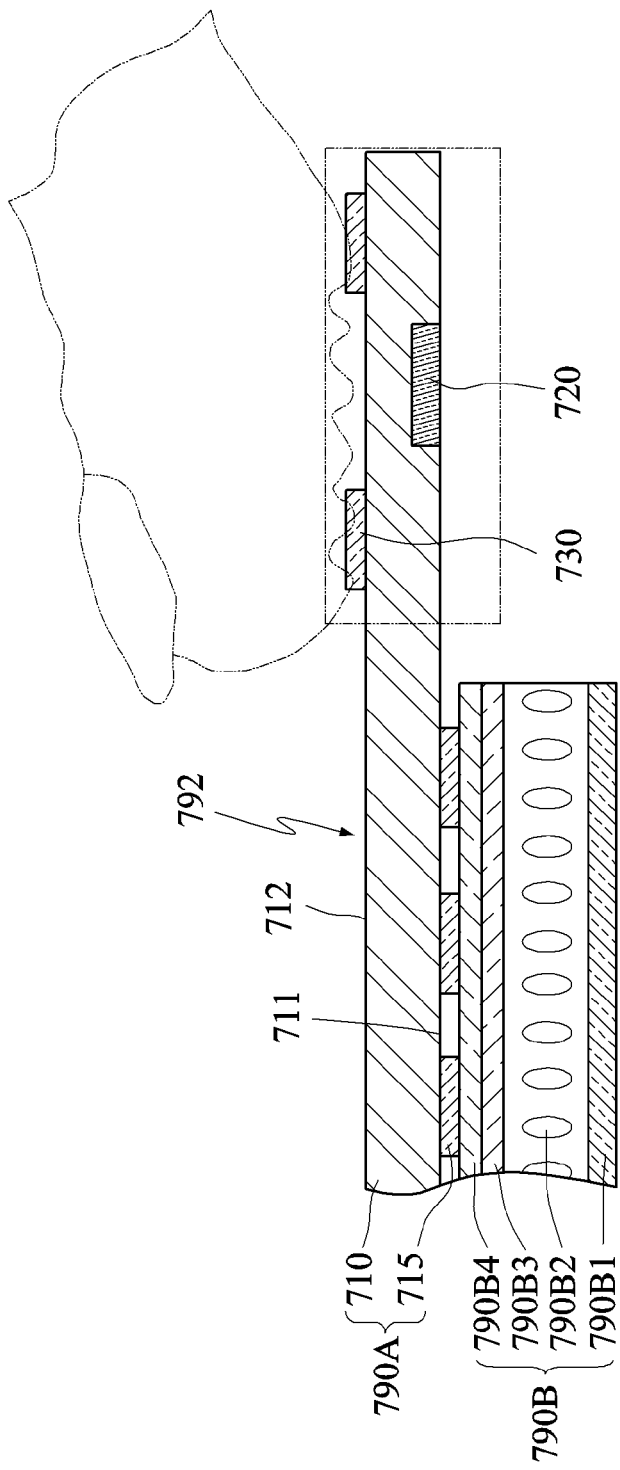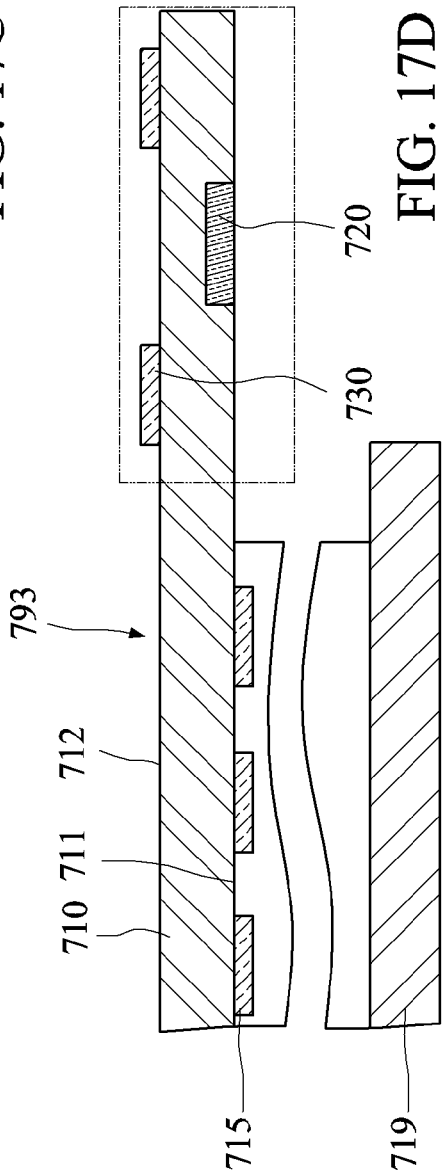

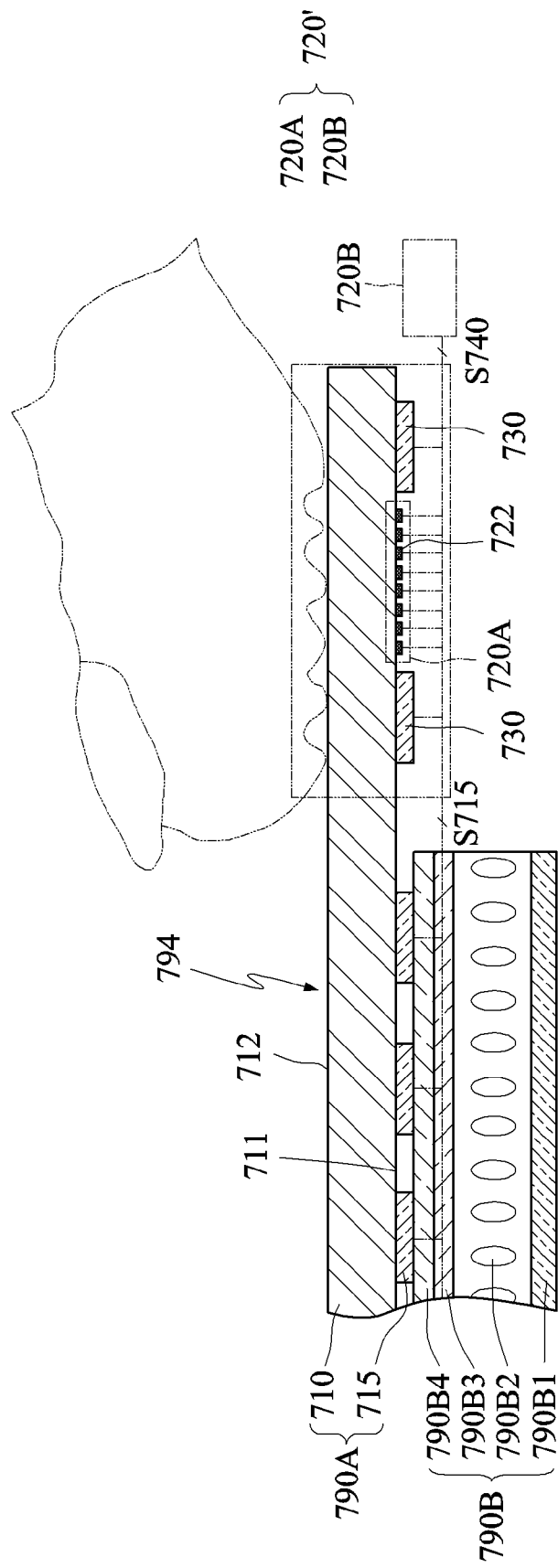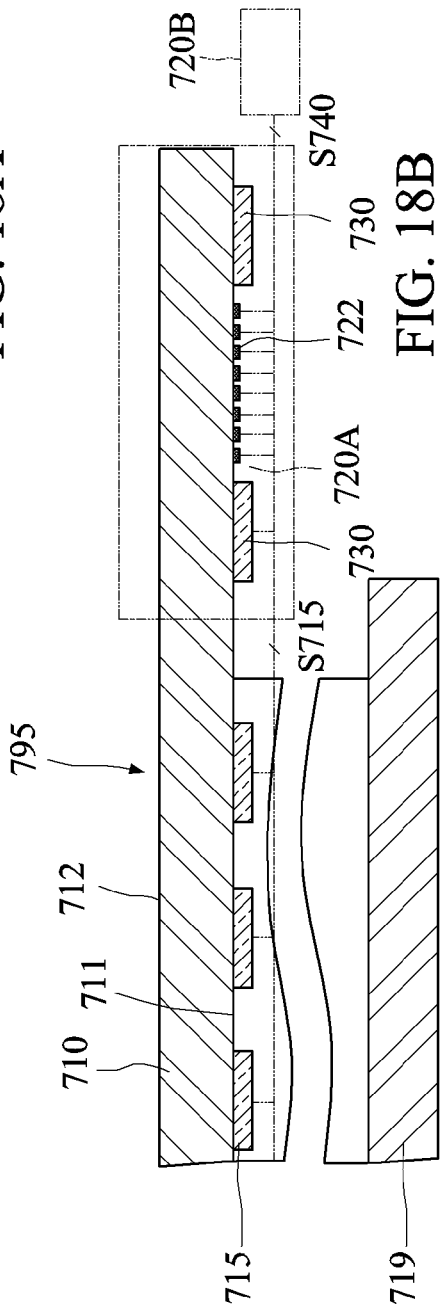
FIG. 18A
FIG. 18B

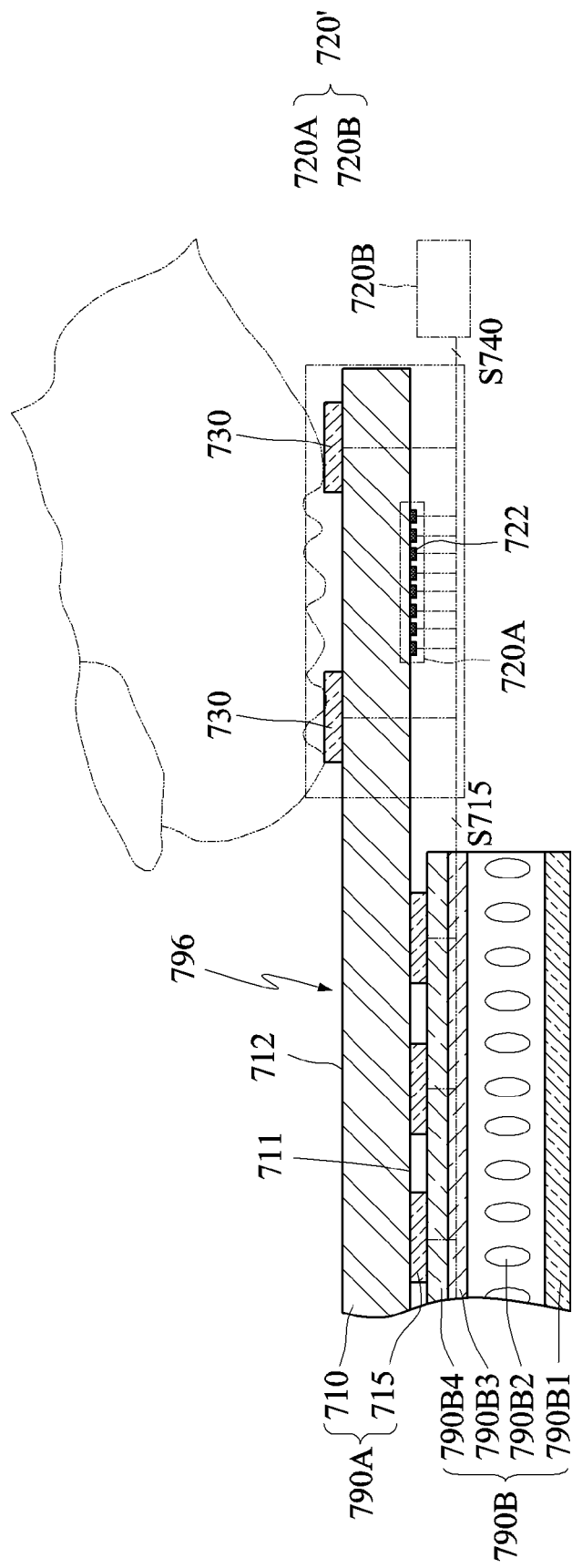
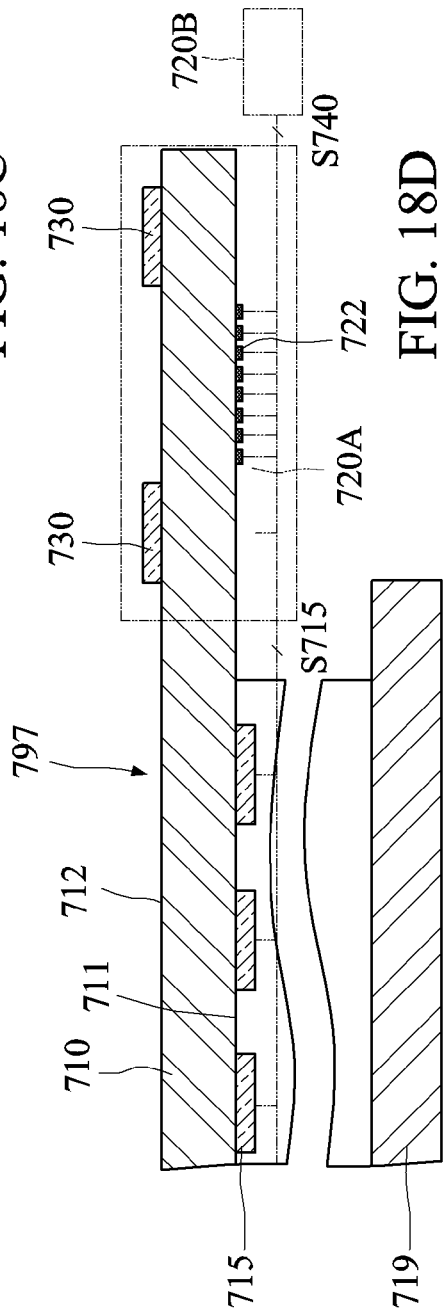
FIG. 18C
FIG. 18D

BIOMETRICS SENSOR MODULE, ASSEMBLY, MANUFACTURING METHOD AND ELECTRONIC APPARATUS USING SUCH BIOMETRICS SENSOR MODULE

This application claims priority of No. 101143369 filed in Taiwan R.O.C. on Nov. 21, 2012 under 35 USC 119, the entire content of which is hereby incorporated by reference.

BACKGROUND OF THE INVENTION

1. Field of the Invention

The invention relates to an active and hidden biometrics sensor module, an active and hidden biometrics sensor module assembly, a manufacturing method of the biometrics sensor module and an electronic apparatus using such a biometrics sensor module.

2. Related Art

The conventional capacitive sensing technology for sensing the skin of the human body may be applied to, for example, the fingerprint sensor for sensing finger's textures or a capacitive touch panel or a capacitive touch screen.

More particularly, the basic structure of the portion of the sensor in contact with the skin's texture to sense the skin's texture is an array-type sensing member. That is, several sensing members with the same structures constitute a two-dimensional array sensor. When a finger is placed on the array sensor, for example, the ridge of the finger's texture is in direct contact with the array sensor, and the valley of the finger's texture is separated from the array sensor by a gap, so that the two-dimensional (2D) capacitive image (or even 3D capacitive image) of the finger's texture may be captured, and this is the basic principle of the capacitive skin texture sensor.

In the most frequently seen sensing member structure, due to the electroconductive property of the human body, the skin in contact with the sensor may be regarded as an equal-potential (virtual grounded) electrode plate and each sensing member may be regarded as a plate electrode, so that a capacitor is formed between each sensing member and the skin. The materials disposed between the electrode plates include the cuticle on the surface of the finger's skin and a sensor protection layer disposed on the sensing electrode and in contact with the skin. The protection layer may be a single insulating layer or may contain multiple insulating layers and must have the environment-corrosion-resistant property, the impact-resistant property, the wearing-resistant property, the electrostatic-discharge-damage-resistant property and the like.

In order to achieve the above-mentioned properties of the protection layer, one direct method is to increase the thickness of the protection layer. However, the too-thick protection layer causes the very small sensing capacitance, thereby decreasing the sensitivity.

FIG. 1 is a schematic illustration showing an assembled structure of a conventional capacitive fingerprint sensor 500. As shown in FIG. 1, the conventional capacitive fingerprint sensor 500 is usually manufactured in two stages. In the first stage of manufacturing a fingerprint sensing chip 510, semiconductor manufacturing processes are utilized to form sensing members 514 and chip bonding pads 515 on a semiconductor substrate 511, and then a chip protection layer 512 is formed on the sensing members 514 to provide the protective and impact-resistant properties. In the second stage, which is a packaging stage, the fingerprint sensing chip 510 is placed on a package substrate 520, multiple wires 530 are bonded to the chip bonding pads 515 and package bonding pads 525 by way of wire bonding, and then a package protection layer (or referred to as an encapsulating layer) 540 is provided to cover the wires 530 and the bonding pads 515 and 525, and only the region with the sensing member array is exposed. Such conventional package processes require a special mold and a special process flow to protect the sensing member region from being covered by the molding compound and need a special machine. So, the cost is high.

In the existing IC wire-bonding technology, the distance from the chip surface 513 to the package surface 523 is greater than or equal to about 100 microns (um). Taking the fingerprint sensor with the specification of 500 DPI as an example, the area of each sensing member 514 is about 50 um×50 um. If the molding compound is to deploy on the sensing member, according to the dielectric constant of the commercial molding compound, the calculated capacitance of the sensing member is smaller than about 1 fF, which is too small to design a sensing circuit. If the thickness control of the package substrate, the thickness control of the chip and the like are considered at the same time, this distance further causes the great sensing error.

Thus, the conventional package protection layer 540 cannot be disposed above and cannot cover the sensing member 514. So, the chip protection layer 512 has to be formed in the first stage, and the thickness (about 1 to 20 microns) of the chip protection layer 512 cannot be too thick to affect the sensing capacitance. Consequently, in addition to the high cost, it is a great challenge to the requirements on the environment-corrosion-resistant property, the impact-resistant property, the wearing-resistant property, the electrostatic-discharge-damage-resistant property and the like of the sensor.

FIG. 2 is a schematic illustration partially showing sensing electrodes of a conventional capacitive fingerprint sensor 600. As shown in FIG. 2, in addition to the sensing capacitor Cf between each sensing electrode 610 of the capacitive fingerprint sensor 600 and the finger F, a parasitic capacitor Cp1 is present when viewed from the sensing electrode 610 to the inside of the chip. In addition, because the sensor device is an array device having a plurality of sensing members, a parasitic capacitor Cp2 is also present between each of the sensing electrodes 610 and each of its neighboring sensing electrodes 610. These parasitic capacitors are in the fluctuating states during the sensor operation mode as the voltage level is changing versus time. This non-constant parasitic capacitor interferes with the measurement, and is one of the main reasons of the incapability of achieving the high sensitivity. In addition, due to the low sensitivity of the prior art, most fingerprint sensors are embedded into the openings of the housings of the electronic apparatus. Thus, the beauty of the outlook of the apparatus is affected, and the dust and dirtiness may be left in the interface between the sensor and the electronic apparatus no that the ID of the apparatus becomes even more ugly.

As shown in FIG. 2A, if a fingerprint sensor 500 is to be mounted on a conventional mobile phone 2000, a housing 2010 of the mobile phone 2000 needs to be formed with an opening 2015, and upper and lower sides of the opening 2015 need to be formed with an inwardly concave slideway 2020 to guide the finger to contact the chip protection layer 512 of the fingerprint sensor 500 and enter the sensing region. Consequently, the overall ID outlook of the mobile phone 2000 is seriously damaged, the dust tends to be left in a clearance 2025 between the fingerprint sensor 500 and the opening 2015, thereby affecting the beauty and the cleanness.

SUMMARY OF THE INVENTION

It is therefore an object of the invention to provide an active and hidden biometrics sensor module, an active and hidden biometrics sensor assembly, a manufacturing method of the active and hidden biometrics sensor and an electronic apparatus using such a biometrics sensor. The biometrics sensor can be hidden in the housing of the electronic apparatus and has the enhanced high sensitivity without affecting the exterior of the electronic apparatus.

To achieve the above-identified object, the invention provides a biometrics sensor module including a housing, a biometrics sensor and a coupling electrode. The housing has a first surface and a second surface opposite to the first surface. The biometrics sensor has a sensing surface disposed on the first surface of the housing, wherein the sensing surface has sensing members arranged in an array. The coupling electrode is disposed on the first surface or the second surface of the housing. Two regions, projected from the sensing surface and the coupling electrode to the second surface of the housing, do not overlap with each other. The coupling signal is provided to the coupling electrode and directly or indirectly coupled to an object, so that the sensing members of the biometrics sensor sense biometrics messages of the object contacting with the second surface of the housing.

The invention also provides an electronic apparatus including the biometrics sensor module, a display and a processor. The display is mounted on the housing and is for displaying images or information to interact with a user. The processor is disposed in the housing and electrically connected to the biometrics sensor and the display, and controls the biometrics sensor and the display to operate.

The invention further provides a biometrics sensor assembly including a flexible circuit board, a biometrics sensor, bonding wires and an encapsulating layer. The biometrics sensor includes a sensing surface, a non-sensing surface, a depressed surface, a side surface, connection pads, bonding pads and connection traces. The sensing surface has sensing members, which are arranged in an array and for sensing biometrics messages. The non-sensing surface is disposed opposite the sensing surface and disposed on the flexible circuit board. The depressed surface is disposed between the sensing surface and the non-sensing surface. The side surface connects the sensing surface to the depressed surface. The connection pads are disposed on the sensing surface. The bonding pads are disposed on the depressed surface. The connection traces connect the connection pads to the bonding pads, respectively. The bonding wires are bonded to the bonding pads and connection portions of the flexible circuit board. The encapsulating layer covers over the bonding wires, the biometrics sensor and the flexible circuit board.

The invention further provides a method of manufacturing a biometrics sensor assembly. The method includes the steps of: forming a circuit element region on a silicon substrate, the circuit element region having sensing members and connection pads; forming a first groove on the substrate; covering an insulation protection layer over the circuit element region of the substrate and the first groove; forming windows on the insulation protection layer above the connection pads; forming a metal layer on the insulation protection layer, the metal layer filling the windows and being electrically connected to the connection pads; patterning the metal layer to form a second groove and connection traces; cutting along the second groove to form multiple independent sensing chips; and performing wire-bonding and package procedures on the sensing chip to form the biometrics sensor assembly.

According to the aspects of the invention, it is possible to implement the active and hidden sensor with the high sensitivity and to apply the sensor to the electronic apparatus to provide the beauty exterior and to effectively prevent the dirt from being left in the interface between the sensor and the housing of the electronic apparatus.

Further scope of the applicability of the present invention will become apparent from the detailed description given hereinafter. However, it should be understood that the detailed description and specific examples, while indicating preferred embodiments of the present invention, are given by way of illustration only, since various changes and modifications within the spirit and scope of the present invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention.

FIGS. 17A to 17D are partially cross-sectional views showing touch displays of electronic apparatuses according to fifth to ninth embodiments of the invention.

FIGS. 18A to 18D are partially cross-sectional views showing touch displays of electronic apparatuses according to tenth to thirteenth embodiments of the invention.

DETAILED DESCRIPTION OF THE INVENTION

The present invention will be apparent from the following detailed description, which proceeds with reference to the accompanying drawings, wherein the same references relate to the same elements.

Figure 3:
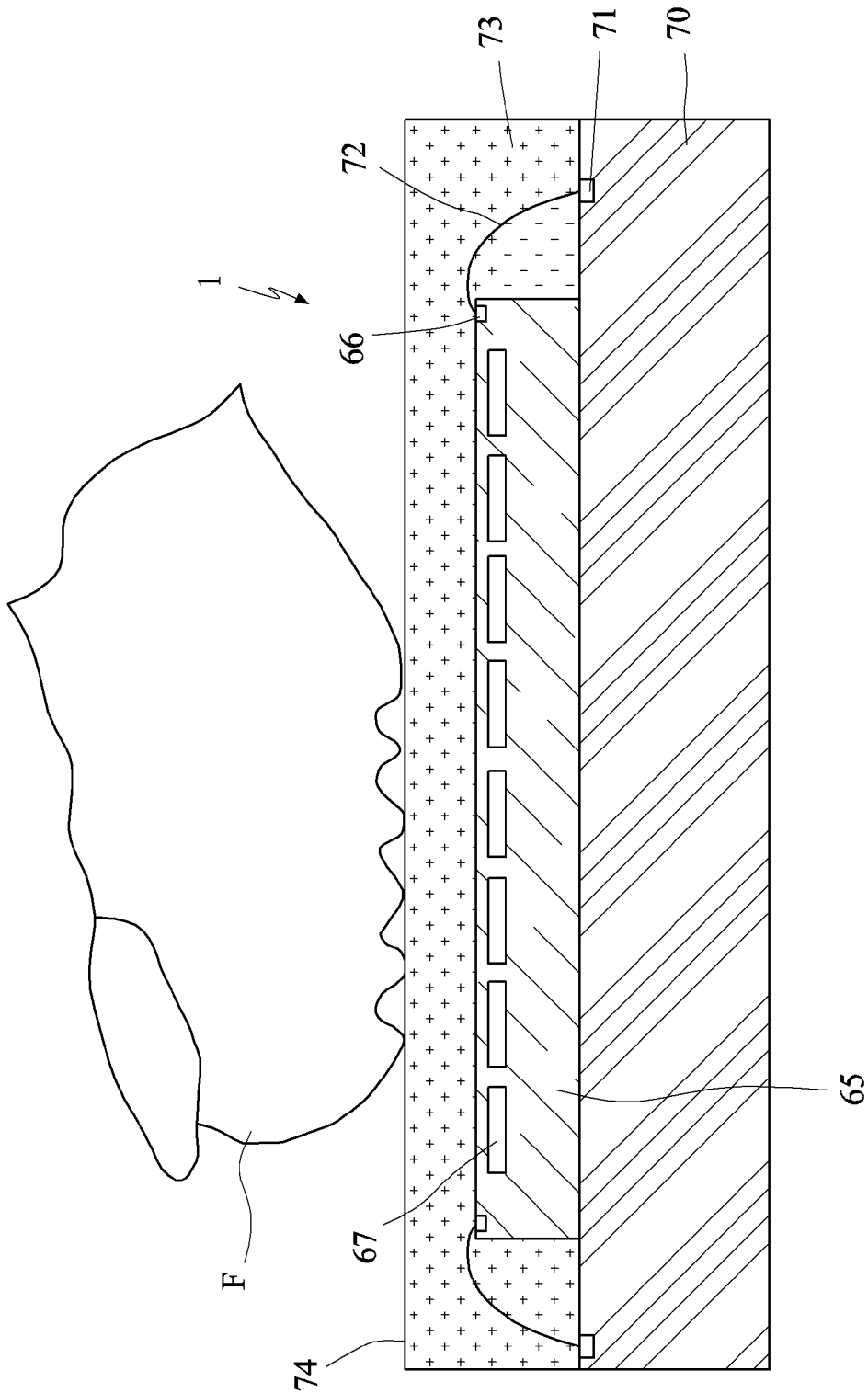
FIG. 3 is a schematic illustration showing a structure of a capacitive sensing array device according to a first application example of the invention.
Figure 4:
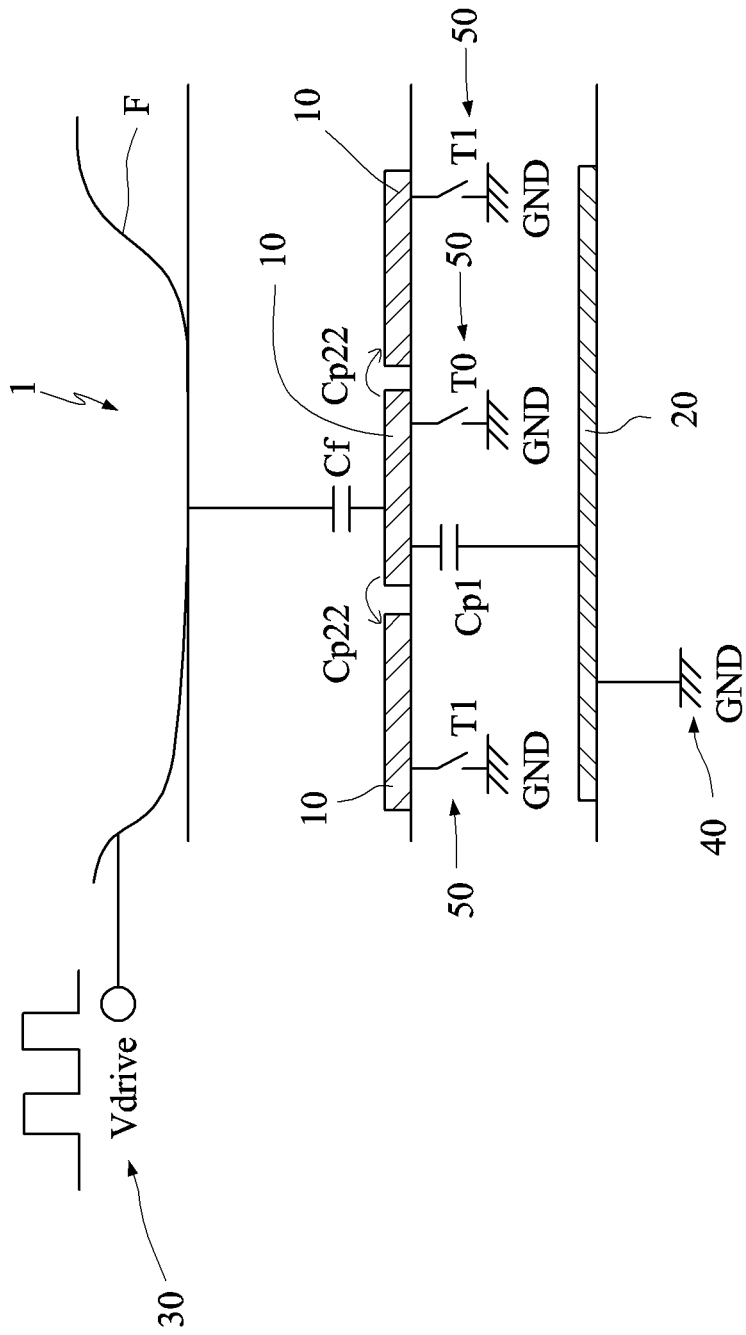
FIG. 4 is a schematic illustration partially showing a structure design of sensing electrodes of the capacitive sensing array device according to the first application example of the invention.
Figure 5:
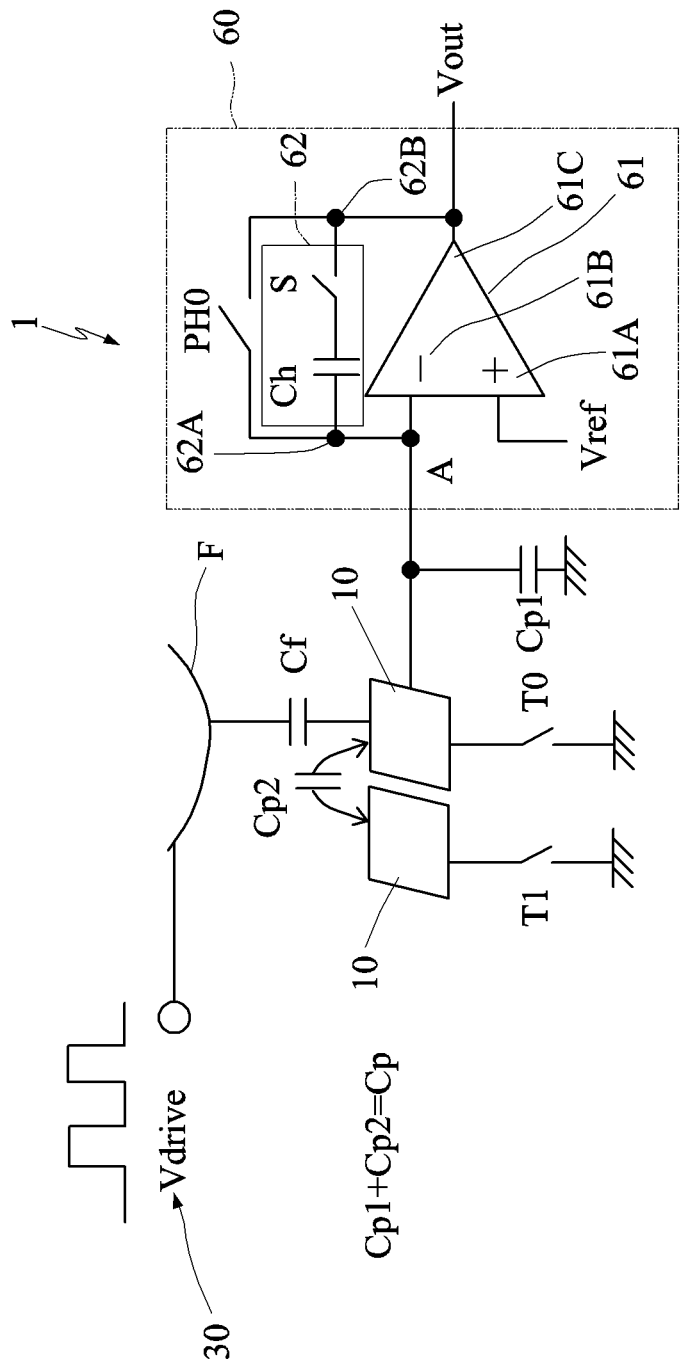
FIG. 5 is a schematic illustration showing a single sensing member and its corresponding sensing circuit of the capacitive sensing array device according to the first application example of the invention.

FIG. 3 is a schematic illustration showing a structure of a capacitive sensing array device 1 according to a first application example of the invention. FIG. 4 is a schematic illustration partially showing a structure design of sensing electrodes of the capacitive sensing array device 1 according to the first application example of the invention. FIG. 5 is a schematic illustration showing a single sensing member and its corresponding sensing circuit of the capacitive sensing array device 1 according to the first application example of the invention. Referring to FIGS. 3 to 5, the capacitive sensing array device 1 of this application example includes sensing electrodes 10, a shielding conductor layer 20, a coupling signal source 30, a constant voltage source 40, switch modules 50, a semiconductor substrate 65, a package substrate 70, wires 72 and a package protection layer 73.

Figure 1:
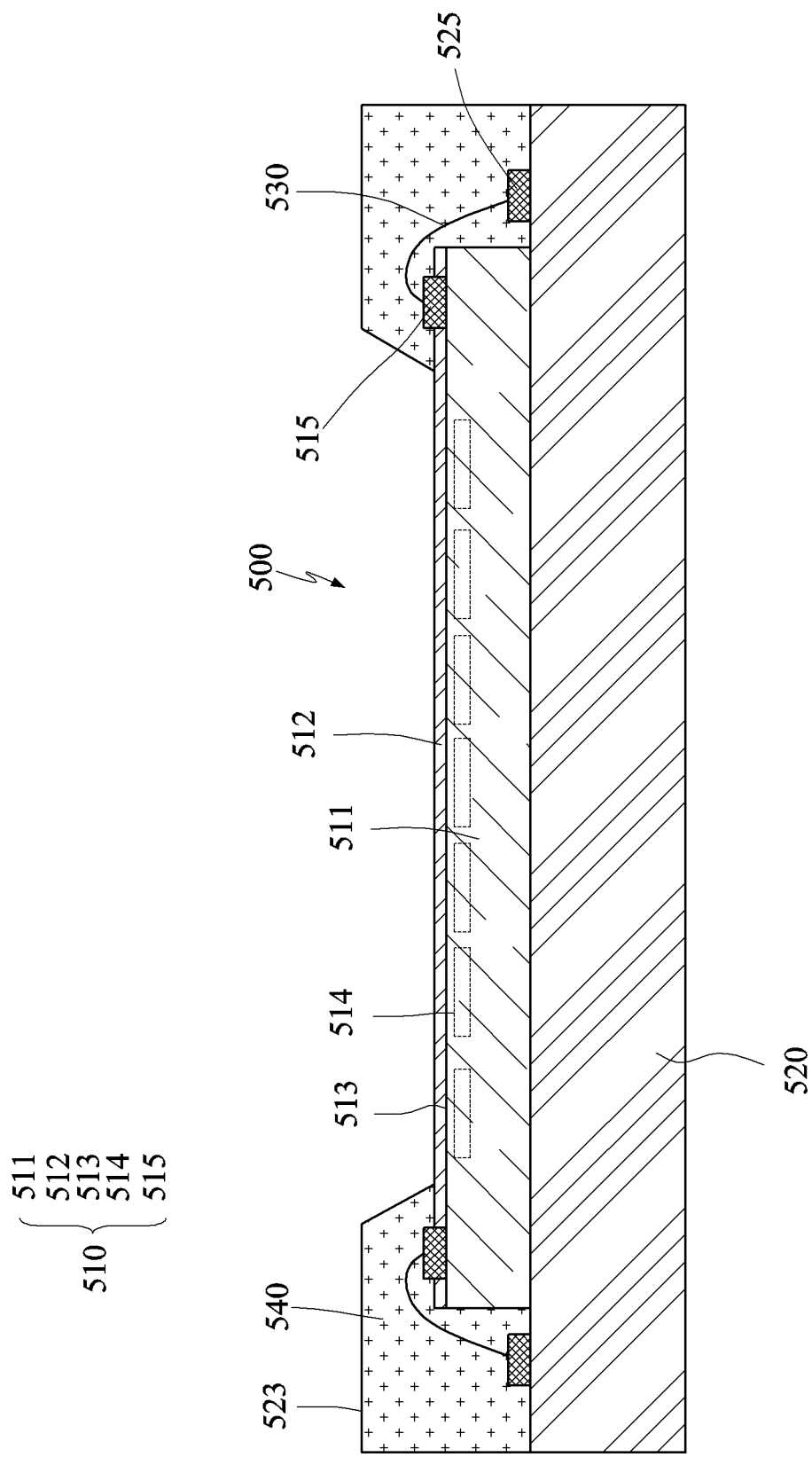
FIG. 1 is a schematic illustration showing a structure of a conventional capacitive fingerprint sensor.
Figure 2:
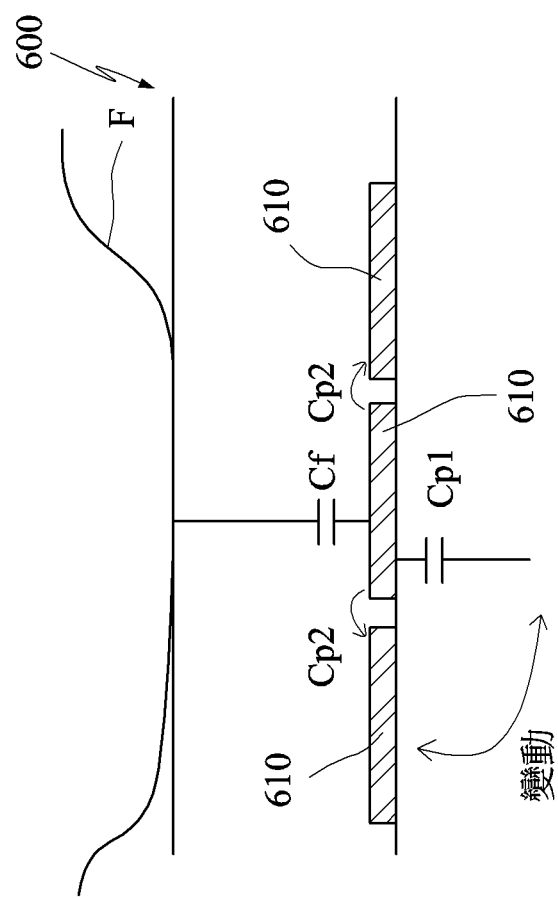
FIG. 2 is a schematic illustration partially showing sensing electrodes of the conventional capacitive fingerprint sensor.
Figure 2A:
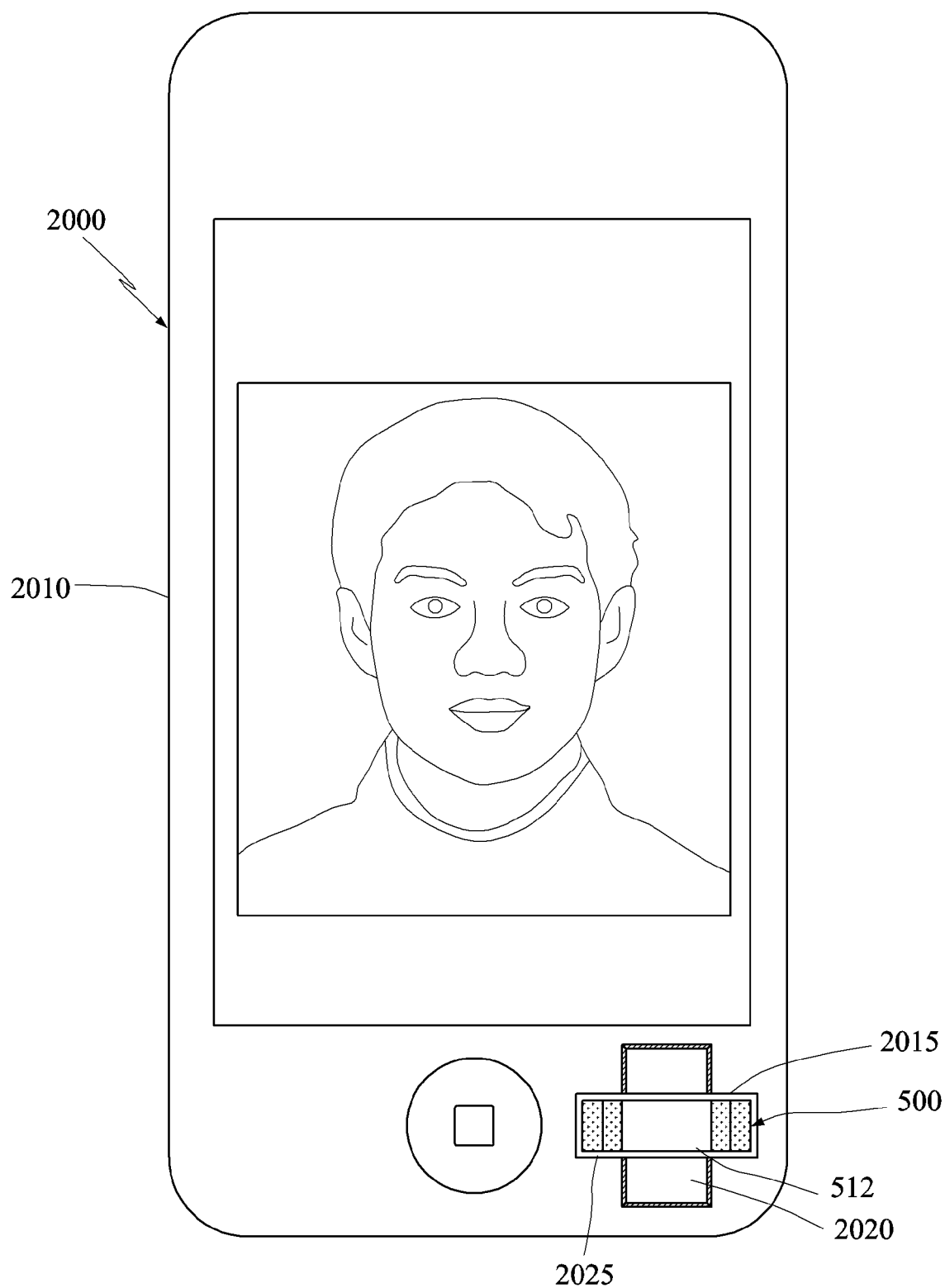
FIG. 2A shows the exterior of a conventional mobile phone.

The sensing electrodes 10, the shielding conductor layer 20, the coupling signal source 30, the constant voltage source 40 and the switch modules 50 may constitute a portion of a sensing member 67 or the whole sensing member, and are formed in the semiconductor substrate 65. Herein, the manufacturing processes applied to the semiconductor substrate include complete front-end and back-end semiconductor manufacturing processes, such as the transistor device manufacturing processes and the interconnect processes. In this application example, these structures are manufactured using, for example, but without limitation to, semiconductor manufacturing processes (e.g., CMOS processes), so that the manufacturing cost is significantly decreased. The semiconductor substrate 65 is disposed on the package substrate 70. Multiple first bonding pads 71 on the package substrate 70 may be electrically connected to multiple second bonding pads 66 on the semiconductor substrate 65 through the wires 72 by way of wire bonding to provide the input/output interface for the signal and the power of the package product. The package protection layer 73 is implemented using a molding compound, typically used in the package, to cover the semiconductor substrate 65, the wires 72, the first bonding pads 71 and the second bonding pads 66. In one example, the material of the package protection layer 73 includes the epoxy resin serving as the molding compound (molding compound), and the package protection layer 73 has the thickness greater than or equal to 100 um, and the hardness greater than 5H, so that the wearing-resistant property, the electrostatic-discharge-damage-resistant property, the impact-resistant property and the like may be provided. In addition, the package protection layer 73 has an exposed surface 74 in contact with an object F, wherein the exposed surface 74 is a flat surface, and the overall exposed surface 74 serves as a complete upper flat surface of the capacitive sensing array device 1 without the concave surface of FIG. 1. Thus, the requirements of the full flat surface device can be satisfied.

Regarding the detailed structure of the sensing member 67, these sensing electrodes 10 are separately arranged in an array form including, without limitation to, a one-dimensional array or a two-dimensional array. Each sensing electrode 10 and the object F form a sensing capacitor Cf. In this example, the object is a finger. However, the invention is not restricted thereto. Any device operating according to the capacitive sensing principle may be used as the sensing array device of the invention.

The shielding conductor layer 20 is disposed below the sensing electrodes 10. The shielding conductor layer 20 and each sensing electrode 10 form a vertical parasitic capacitor Cp1. The shielding conductor layer 20 may be a complete piece of conductor plate formed with a conducting layer, may also be multiple pieces of plates formed with the same conducting layer, and may correspond to the sensing electrodes 10 in a one-to-one, one-to-many or many-to-one manner so as to provide the constant parasitic capacitor.

In FIG. 4, the middle sensing electrode 10 and its surrounding members also form a horizontal parasitic capacitor Cp22. These horizontal parasitic capacitors Cp22 are equivalent to a horizontal parasitic capacitor Cp2 in FIG. 5. Thus, the sensing electrode 10 and its neighboring sensing electrodes 10 form the horizontal parasitic capacitor Cp2.

The shielding conductor layer 20 and the sensing electrodes 10 may be formed using the metallic interconnect manufacturing process of the semiconductor manufacturing processes. The material between the shielding conductor layer 20 and the sensing electrodes 10 may contain a single-layer or multiple inter-metal dielectrics (IMD) layers. The sensing members may be formed using multiple metal and IMD manufacturing processes of the semiconductor manufacturing processes.

The coupling signal source 30 is coupled to the object F and provides a coupling signal Vdrive coupled to the object F. The coupling signal Vdrive may be directly or indirectly coupled to the object F, wherein the direct coupling may transfer the coupling signal to the object F using a coupling electrode in contact with the object F, and the indirect coupling may be implemented by disposing a dielectric layer between the coupling electrode and the object F. Since the direct coupling and the indirect coupling are well known in the art, detailed descriptions and restrictions thereof will be omitted.

The constant voltage source 40 provides a constant voltage to the shielding conductor layer 20 so that a stable vertical parasitic capacitor Cp1 is formed between the shielding conductor layer 20 and each sensing electrode 10. In this application example, the grounding voltage (GND) of 0V serves as the constant voltage. However, the invention is not restricted thereto, the constant voltage may also be equal to 3.3V, 5V or the like to achieve the effect of the invention. However, it is to be noted that the constant voltage source must provide the very stable voltage, which cannot fluctuate under the external interference. This is because the fluctuating voltage would decrease the sensitivity of the sensing member.

These switch modules 50 are only represented by T0 and T1 in FIGS. 4 and 5, and these switch modules 50 are electrically connected to the constant voltage source and these sensing electrodes 10 in a one-to-one manner. When one sensing electrode 10 is selected to perform the sensing, the switch modules 50 are configured such that an open-circuited state is formed between the sensing electrode 10 and the constant voltage source 40, while the short-circuited state is formed between all the other sensing electrodes 10 and the constant voltage source 40, so that a stable horizontal parasitic capacitor Cp2 is formed between the selected sensing electrode 10 and the surrounding other sensing electrodes 10, and that the output of the capacitive sensing array device 1 does not relate to the horizontal parasitic capacitor Cp2 and the vertical parasitic capacitor Cp1 (see the following derivation). The switch module 50 may be implemented by, for example but without limitation to, a transistor or any other suitable means. In FIGS. 4 and 5, when the middle sensing electrode 10 is selected to perform the sensing, the switch module T0 is in the open-circuited state, and the switch module T1 is in the short-circuited state (i.e., turned-on state). Consequently, the surrounding sensing electrodes 10 are grounded (or coupled to the constant voltage), while the bottom shielding conductor layer 20 is set as the grounded state (or coupled to the constant voltage). As a result, a stable shielding environment may be provided to completely surround the sensing electrode therein. Although a relatively large parasitic capacitor is still present between the sensing electrode and the neighboring shielding environment, this parasitic capacitor is different from the conventional design and has a constant and stable capacitance value. This is advantageous to the design of the sensing circuit.

As shown in FIG. 5, the capacitive sensing array device 1 may further include reading circuits 60, which are electrically connected to the sensing electrodes 10 and output multiple output signals Vout, respectively. In this application example, in order to prevent the signal of each sensing electrode from being transmitted too far and interfered, each sensing member is configured to be connected to a complete or partial operational amplifier for amplifying the sensing signal on site. Thus, the invention is free from the interference caused by the too-long transmission line (array device's usual issue). Therefore, each reading circuit 60 includes an operational amplifier 61, a tunable capacitor 62 and a reset switch PH0.

All or a portion of the operational amplifier 61 may be formed under the sensing electrode 10, and one sensing electrode 10 may correspond to one operational amplifier 61. Of course, multiple sensing electrodes 10 may also correspond to one operational amplifier 61. The operational amplifier 61 has a positive input terminal 61A, a negative input terminal 61B and an output terminal 61C. The negative input terminal 61B is electrically connected to the sensing electrode 10, and the positive input terminal 61A is electrically connected to a reference voltage Vref. The tunable capacitor 62 has a first terminal 62A electrically connected to the negative input terminal 61B, and a second terminal 62B electrically connected to the output terminal 61C. In this example, the tunable capacitor 62 is constituted by a capacitor Ch and a switch S. In this example, because only one capacitor Ch is provided, the switch S may be removed. The reset switch PH0 and the tunable capacitor 62 are connected in parallel.

According to the circuit diagram of FIG. 5, the output signal Vout may be derived according to the electrical charge conservation principle.

When Vdrive=0, the reset switch PH0 is in the short-circuited state, and the charge Q1 at the node A may be represented by:

$$Q1 = Cf \times (Vref - Vdrive) + Cp \times Vref = Cf \times Vref + Cp \times Vref.$$

When Vdrive is high, the reset switch PH0 is in the open-circuited state, and the charge Q2 at the node A may be represented by:

$$Q2 = Cf \times (Vref - Vdrive) + Cp \times Vref + Ch \times (Vref - Vout).$$

According to the electrical charge conservation principle, Q1=Q2 may be obtained.

That is, $$Cf \times Vref + Cp \times Vref = Cf \times Vref - Cf \times Vdrive + Cp \times Vref + Ch \times Vref - Ch \times Vout.$$

The expression may be simplified as:

$$Cf \times Vdrive - Ch \times Vref = -Ch \times Vout.$$

Then, it is obtained:

$$Vout = Vref - (Cf/Ch) \times Vdrive,$$

wherein Cp=Cp1+Cp2. According to the above-mentioned equation, it is found that the output signal Vout does not relate to the parasitic capacitors Cp1 and Cp2. As mentioned hereinabove, the feature of the invention is to stabilize the fluctuating value of the parasitic capacitor, which fluctuates due to the uncontrolled surrounding environment, so that the parasitic capacitor may be naturally neglected under the operation principle of the operational amplifier sensing circuit. In addition, Cf/Ch is a gain. In the practical design, Ch is as small as possible because the sensing signal may be amplified in each independent sensing member so that the sensing signal cannot be interfered in the transmission line to affect the signal quality. In one application example of the invention, Vdrive is equal to 3.3V, Vref is equal to 1.8V, and Ch ranges from 1 to 4 fF. However, the invention is not particularly restricted thereto.

Figure 6:
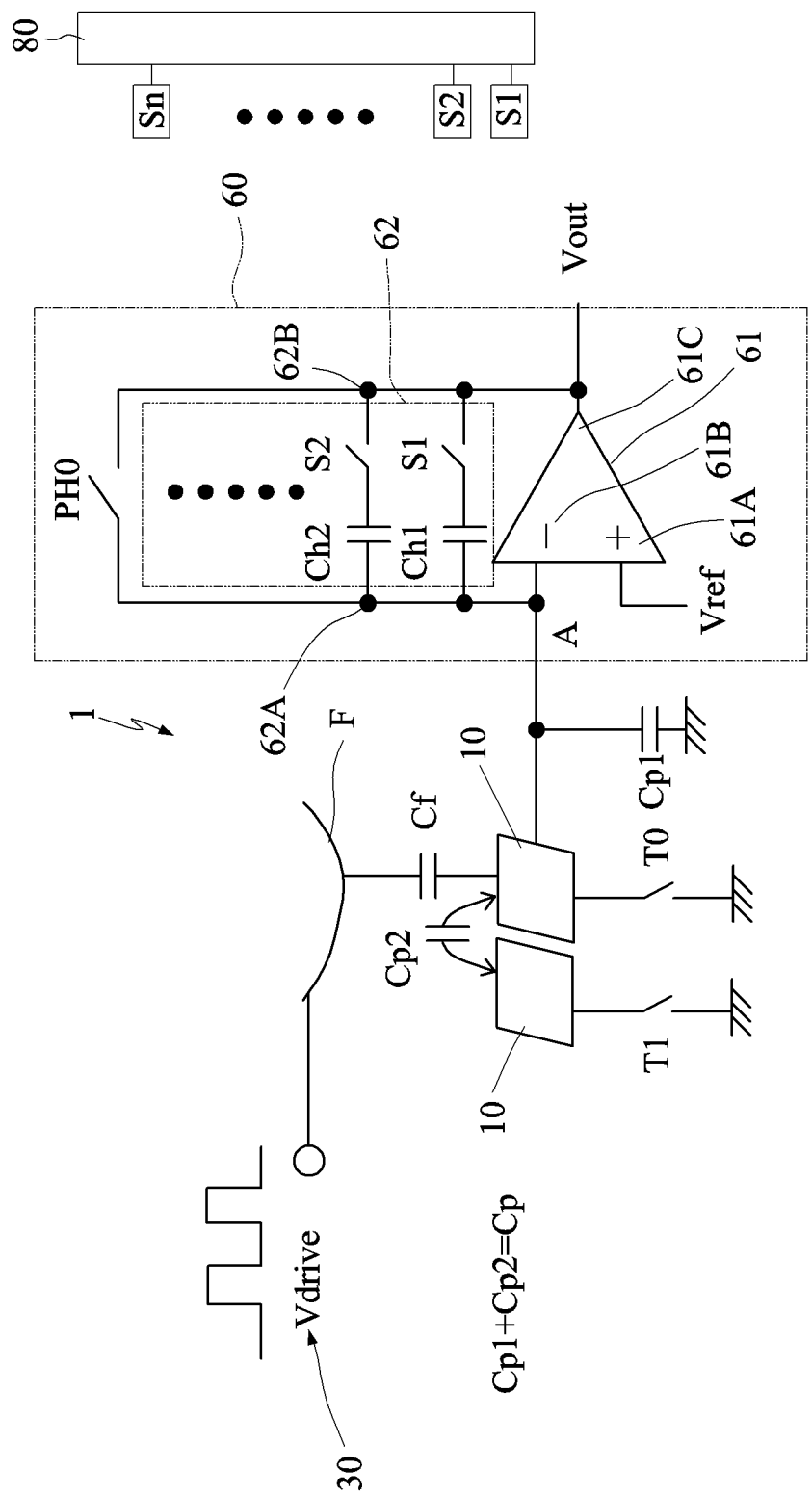
FIG. 6 is a schematic circuit diagram showing a single sensing member and its corresponding sensing circuit of a capacitive sensing array device according to a second application example of the invention.

FIG. 6 is a schematic circuit diagram showing a single sensing member and its corresponding sensing circuit of a capacitive sensing array device 1 according to a second application example of the invention. As shown in FIG. 6, this application example is similar to the first application example except for the difference that the tunable capacitor 62 includes reference capacitors Ch1 to CHn connected to the negative input terminal 61B and the output terminal 61C in parallel through multiple reference switches S1 to Sn, respectively. The capacitance of the tunable capacitor 62 may be adjusted by controlling the open-circuited states and the short-circuited states of the reference switches S1 to Sn.

In this example, the capacitive sensing array device 1 may further include a reference switch controller 80, which is electrically connected to the reference switches S1 to Sn, and controls the open-circuited states and the short-circuited states of the reference switches S1 to Sn. The reference switch controller 80 may turn on one of the reference switches S1 to Sn at a time. In this condition, the reference capacitors Ch1 to CHn are preferably configured to have multiple capacitances. Alternatively, the reference switch controller 80 may also turn on multiple ones of the reference switches S1 to Sn at a time. In this condition, these reference capacitors Ch1 to CHn have the same capacitance value. Of course, the reference capacitors Ch1 to CHn may also have different capacitance values. The short-circuited states or the open-circuited states of the reference switches S1 to Sn may also be controlled by another control unit.

Instead of sharing one gain adjusting unit by the sensing members, the self gain adjustment is present in each sensing member. So, the signal may be transmitted by a long distance without being interfered by the noise caused by the external traces. Because the manufacturing tolerance does exist, the protection layer with the designed thickness of 100 um may have the thickness ranging from 80 to 130 um. Using the self gain adjustment, it is possible to eliminate the problem caused by the difference between the manufacturing processes, and to effectively enhance the image uniformity and sensitivity adjustment. This is the most important issue for any sensing member array. The gain of each sensing member may be independently adjusted to achieve the uniform image and signal intensity.

Figure 7:
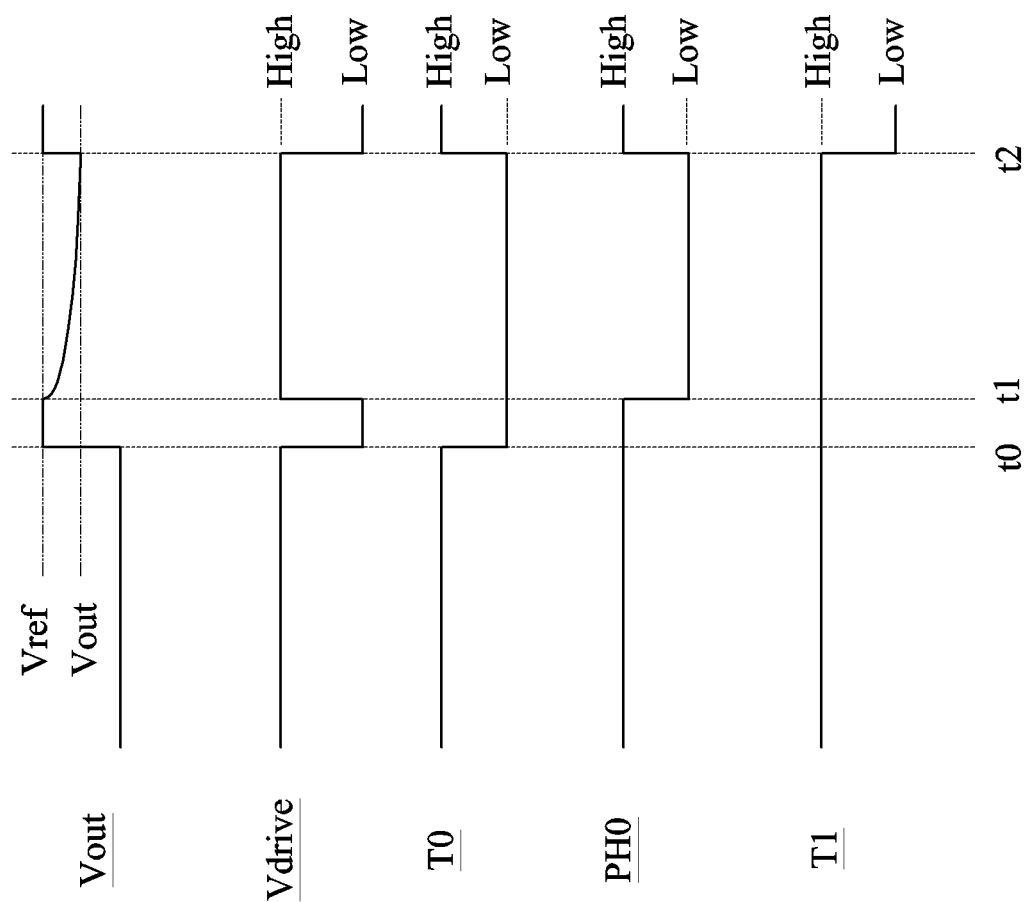
FIG. 7 is a control timing chart of the single sensing member of the capacitive sensing array device according to the second application example of the invention.

FIG. 7 is a control timing chart of the single sensing member of the capacitive sensing array device 1 according to the second application example of the invention. As shown in FIG. 7, in the duration from time t0 to t1, the switch T0 is set as the open-circuited state, the switch T1 is set as the short-circuited state, and the switch PH0 is set as the short-circuited state. At this time, the coupling signal Vdrive has the low level (0V in this application example), and this stage is the pre-charge operation of the operational amplifier of the sensing member. Then, in the duration from time t1 to t2, Vdrive is set to the high level (3.3V in this application example), the switch T0 continuously keeps in the open-circuited state, the switch T1 continuously keeps in the short-circuited state, but the switch PH0 switches to the open-circuited state. In this stage, the sensing operation of the sensing electrode 10 corresponding to the switch T0 is started by way of charge sharing, and the sensed result is amplified to obtain Vout by the operational amplifier inside the single sensing member. Similarly, each of the next sensing members also performs the operation mentioned hereinabove, so that the signals of the sensing member array can be completely read out. The output signal Vout represents the condition of the operation of each single sensing member and the to-be-tested object F.

Heretofore, the application example of the invention proposes a capacitive sensor device with the high sensitivity and can be adapted to the following embodiments of the invention. However, the embodiments of the invention are not restricted thereto.

Figure 8:
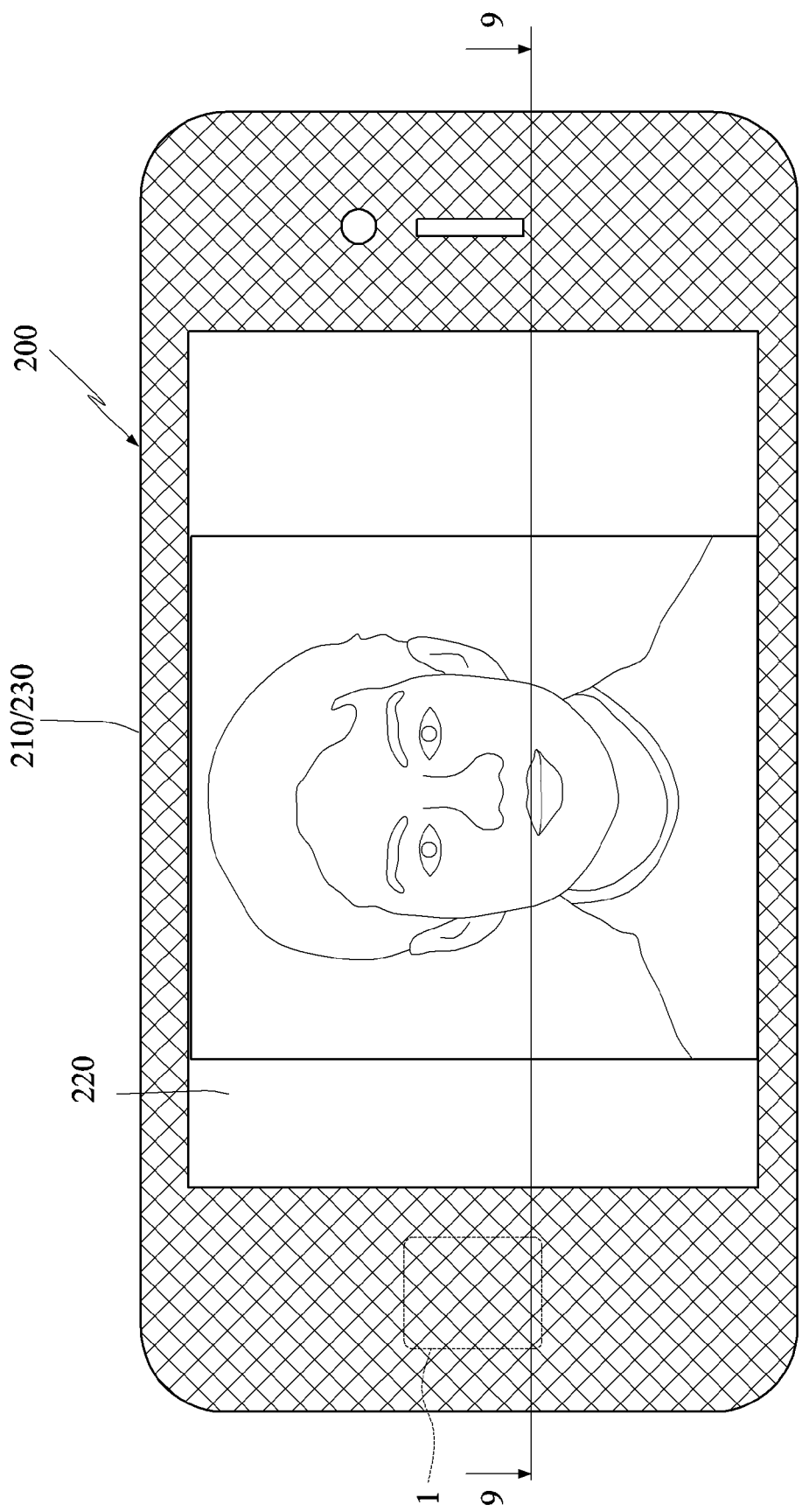
FIG. 8 is a schematic illustration showing an electronic apparatus according to the application example of the invention.
Figure 9:
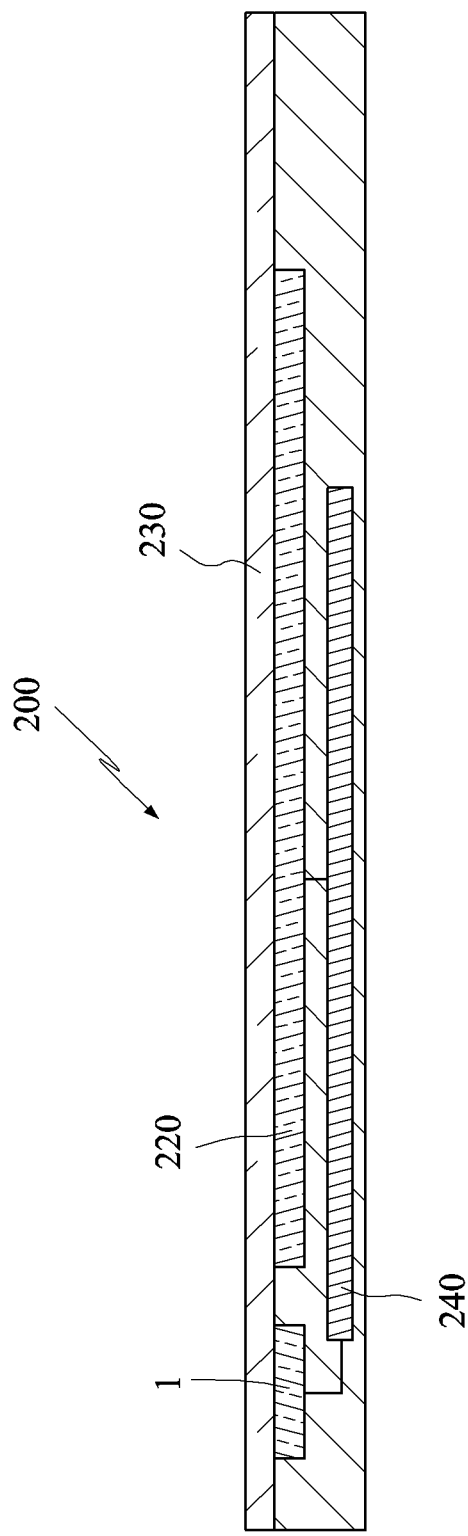
FIG. 9 is a cross-sectional view taken along a line 9-9 of FIG. 8.

FIG. 8 is a schematic illustration showing an electronic apparatus 200 according to the application example of the invention. FIG. 9 is a cross-sectional view taken along a line 9-9 of FIG. 8. Referring to FIGS. 8 and 9, the electronic apparatus 200 of the invention includes a body 210, a display 220, a capacitive sensing array device 1, a housing 230 and a processor 240. The display 220 mounted on the body 210 displays a frame. The capacitive sensing array device 1 is mounted on the body 210. The housing 230 is mounted on the body 210 and covers the display 220 and the capacitive sensing array device 1. The capacitive sensing array device 1 senses the pattern of the object F via the housing 230. The processor 240, electrically connected to the capacitive sensing array device 1 and the display 220, processes the pattern of the object F and interacts with a user through the display 220. The housing 230 may be transparent or opaque, and may also be, for example but without limitation to, an upper cover, a lower cover or a side cover of the electronic apparatus.

Figure 10:
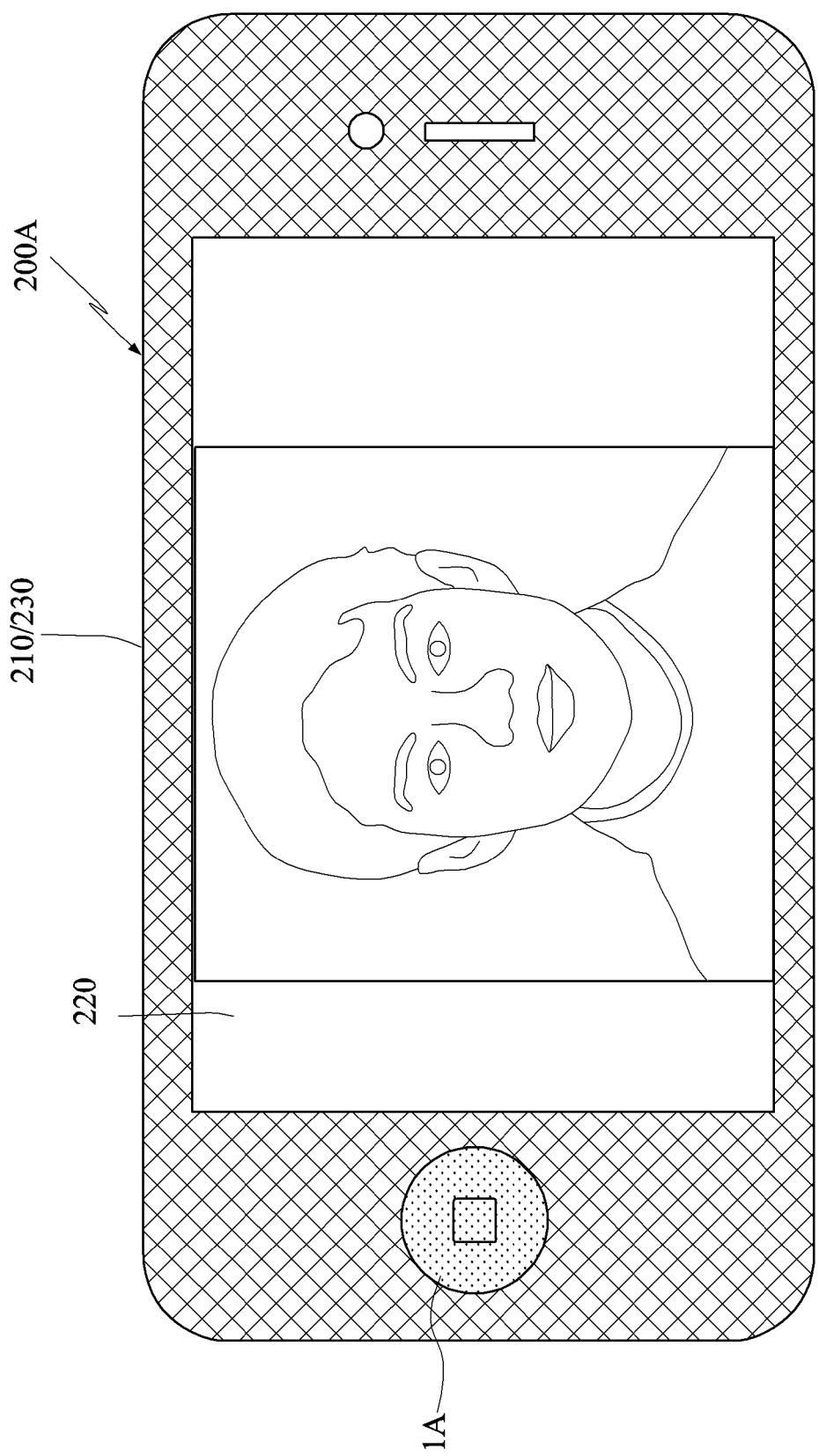
FIG. 10 is a schematic illustration showing another electronic apparatus according to the application example of the invention.

FIG. 10 is a schematic illustration showing another electronic apparatus 200A according to the application example of the invention. As shown in FIG. 10, the electronic apparatus 200A is similar to the electronic apparatus 200 of FIG. 8 except for the difference that the capacitive sensing array device 1A is disposed in a button (a hidden concept is also introduced) to function as a main button and an arrow button of the electronic apparatus 200A. Of course, the button may further include a mechanical pressing switch to have the sensing function as well as the touch function and to facilitate the user recognizing at the button region. Thus, in addition of the provision of the function of sensing the object, the capacitive sensing array device may further provide the button function so that the user can input a control instruction, including, for example but without limitation to, the selection and movement instructions, through the capacitive sensing array device.

With the capacitive sensing array device of the invention, even if the capacitive sensing array device is covered by the protection layer and the housing in contact with the finger, the high sensitivity still can be obtained, and the sensed result cannot be affected by the parasitic capacitor. Furthermore, the uniformity of the sensed image can be further enhanced according to the self gain adjustment.

Figure 11A:
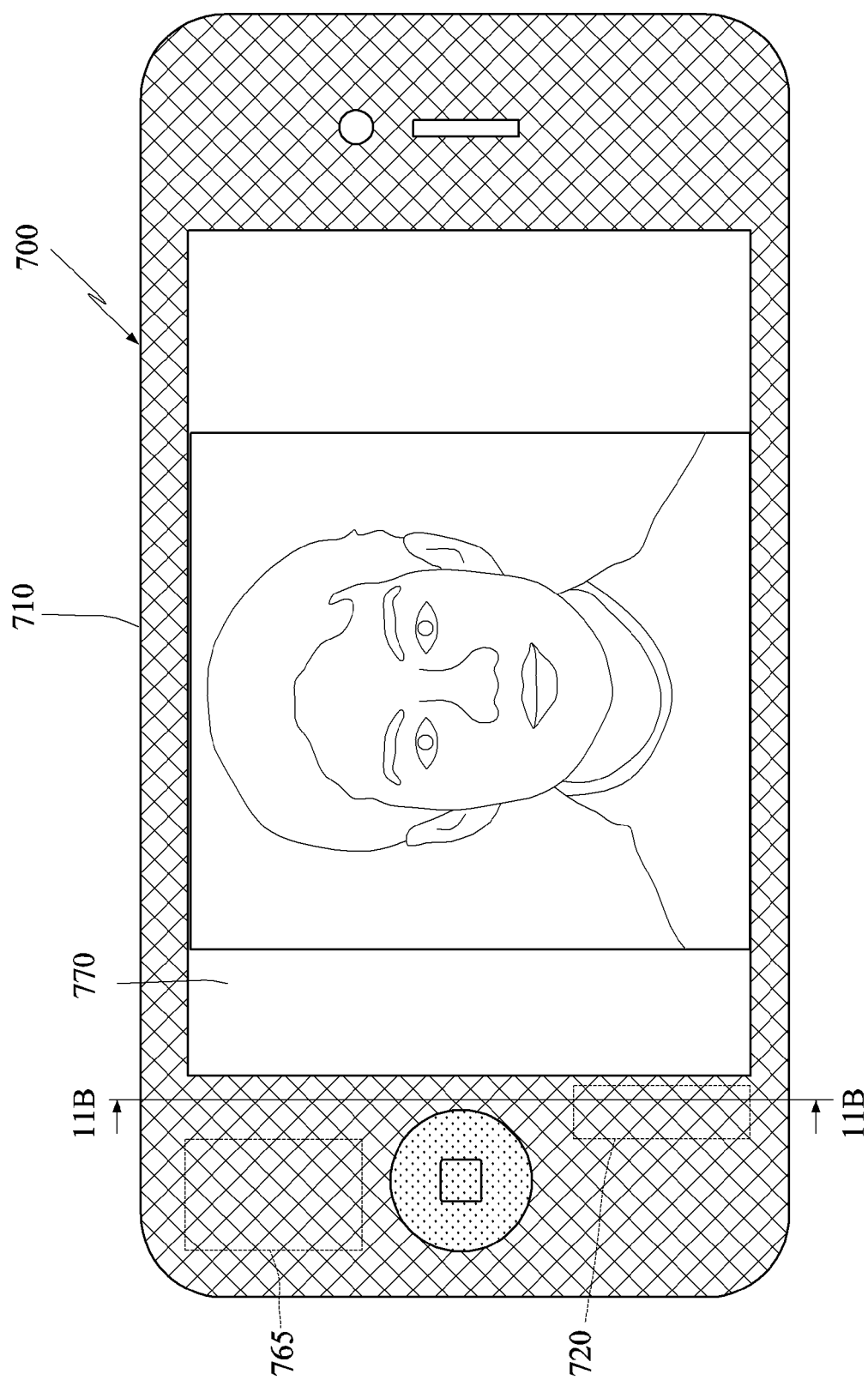
FIG. 11A is a schematic illustration showing an electronic apparatus according to a first embodiment of the invention.
Figure 11B:
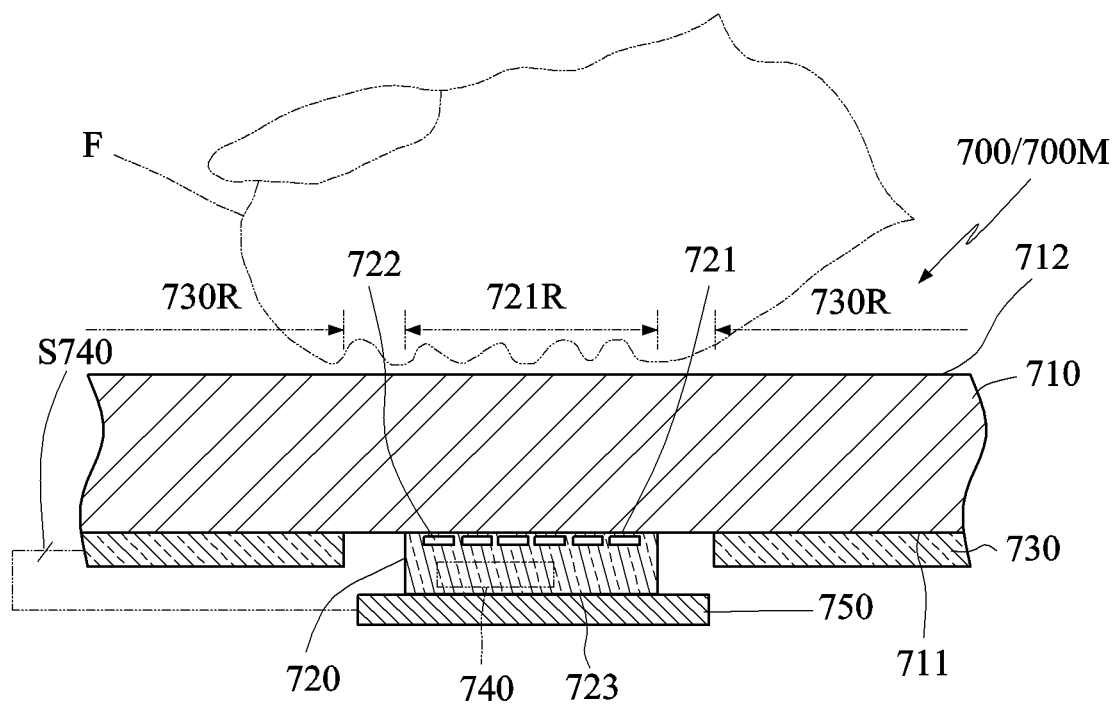
FIG. 11B is a partially cross-sectional view taken along a line 11B-11B of FIG. 11A.

FIG. 11A is a schematic illustration showing an electronic apparatus 700 according to a first embodiment of the invention. FIG. 11B is a partially cross-sectional view taken along a line 11B-11B of FIG. 11A. Referring to FIGS. 11A and 11B, the electronic apparatus 700 of this embodiment at least includes a housing 710, a biometrics sensor 720, a coupling electrode (or referred to as an electroconductive layer) 730, a display 760 and a processor 765. The display 760, mounted on the housing 710, displays images or information to interact with the user. The processor 765, which is disposed in the housing 710 and electrically connected to the biometrics sensor 720 and the display 760, controls operations of the biometrics sensor 720 and the display 760. It is to be noted that after the housing 710, the display 760, the processor 765 and the associated elements are removed from the electronic apparatus 700, an active and hidden biometrics sensor module 700M may be obtained. That is, the biometrics sensor module 700M can be combined with the housing 710, the display 760, the processor 765 and the associated elements to obtain the electronic apparatus 700. Thus, the biometrics sensor module 700M includes the biometrics sensor 720 and the coupling electrode 730, and a portion of the housing or the entire housing.

The housing 710 has a first surface 711 and a second surface 712 opposite to the first surface 711. The housing 710 may be, for example, a front cover, a back cover or a side cover of a mobile phone. The housing 710 may be transparent or opaque.

The biometrics sensor 720 has a sensing surface 721. The sensing surface 721 is disposed on the first surface 711 of the housing 710, and may be adhered to the first surface 711 through an adhesive, for example. The sensing surface 721 has sensing members 722 arranged in an array for sensing a pattern of textures of an object F (e.g., a finger). Of course, the sensing members 722 may also sense the subcutaneous tissues or the vein pattern of the finger. In this embodiment, the sensing members 722 sense the finger textures (referred to as the fingerprint) according to the technical feature that the resolution of the sensing member array has to be greater than or equal to 300 DPI for the finger textures so that the fingerprint can be easily analyzed and the algorithm processing can be performed. Such sensing requirements have the difficulty much higher than that of the conventional projective touch panel, in which only 5 DPI is needed.

The coupling electrode 730 is disposed on the first surface 711 of the housing 710. In one example, an indium tin oxide (ITO) may be formed on the first surface 711 to form a transparent electroconductive film. In other embodiments, other materials with the electroconductive property may also be adopted to form the coupling electrode 730.

Figure 16:
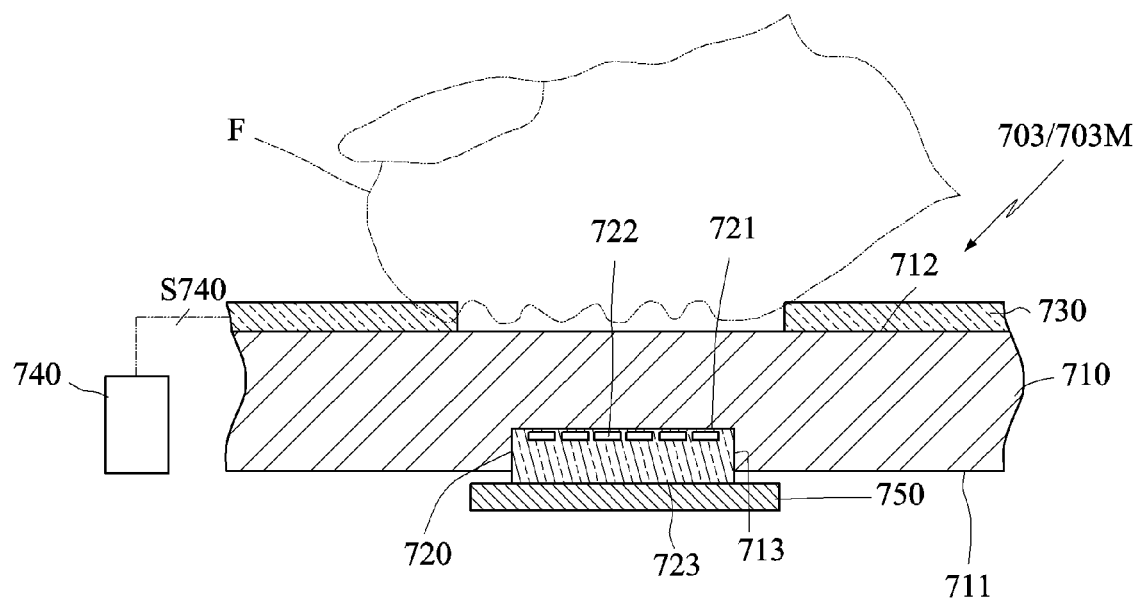
Figure 18E:
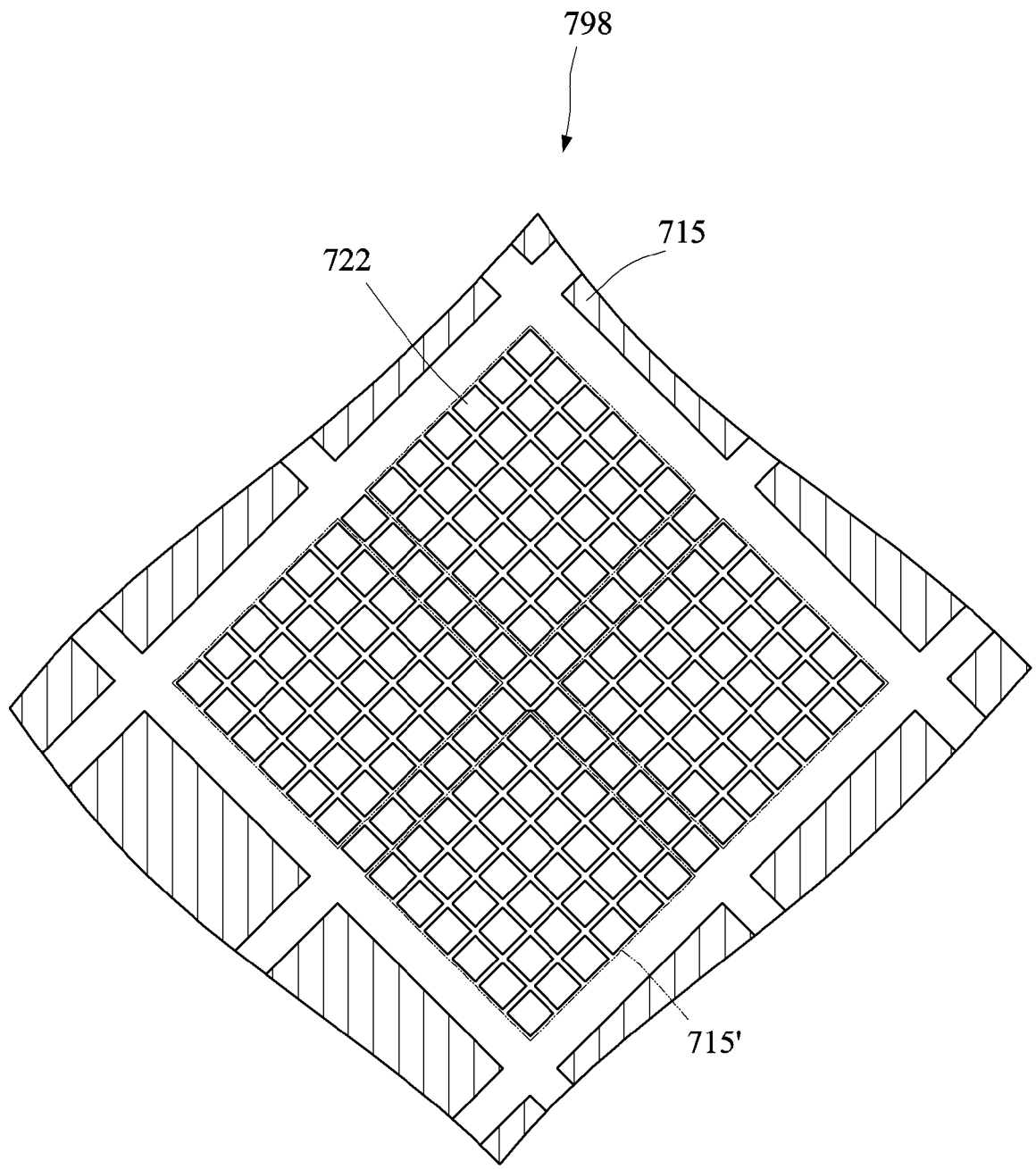
FIG. 18E is a partial top view showing a touch display of an electronic apparatus according to a $14^{th}$ embodiment of the invention.

A coupling signal S740 may be provided from a drive circuit 740 to the coupling electrode 730 and be directly or indirectly coupled to the object F, so that the sensing members 722 of the biometrics sensor 720 sense biometrics messages of the object F directly contacting with the second surface 712 of the housing 710. In this embodiment, the drive circuit 740 is disposed in the biometrics sensor (sensing chip) 720; while in another embodiment, the drive circuit 740 may be disposed independently (i.e., disposed outside the biometrics sensor 720 and being coupled to the coupling electrode 730, as shown in FIG. 16), or may be integrated with other ICs to form a driver IC for a display, for example. Meanwhile, the sensing principle of the sensing chip of the invention is similar to that of the touch panel, so the sensing chip and the touch panel IC may be integrated into a single chip, the sensing chip and the display driver IC may be integrated into a single chip, or the sensing chip, the display driver IC and the touch panel IC may be integrated into one single chip.

Two regions 721R, 730R of the sensing surface 721 and the coupling electrode 730 projected onto the second surface 712 of the housing 710 do not overlap with each other. In this embodiment, the first surface 711 above the sensing surface 721 is not shielded by the coupling electrode 730. The electroconductive layer 730, which is the coupling electrode of the application example only provides the coupling signal S740 indirectly coupled to the object F, whereas the finger F disposed above the sensing surface 721 cannot be shielded by the coupling electrode 730 to prevent the sensing from being affected.

In addition, the electronic apparatus 700 of this embodiment further includes a flexible circuit board 750.

In this embodiment, the flexible circuit board 750 is directly electrically connected to the biometrics sensor 720 and is directly or indirectly electrically connected to the coupling electrode 730. A non-sensing surface 723 of the biometrics sensor 720 disposed opposite the sensing surface 721 is mounted on the flexible circuit board 750. The non-sensing surface 723 does not have the function of sensing the biometrics characteristic pattern of the object.

Figure 12A:
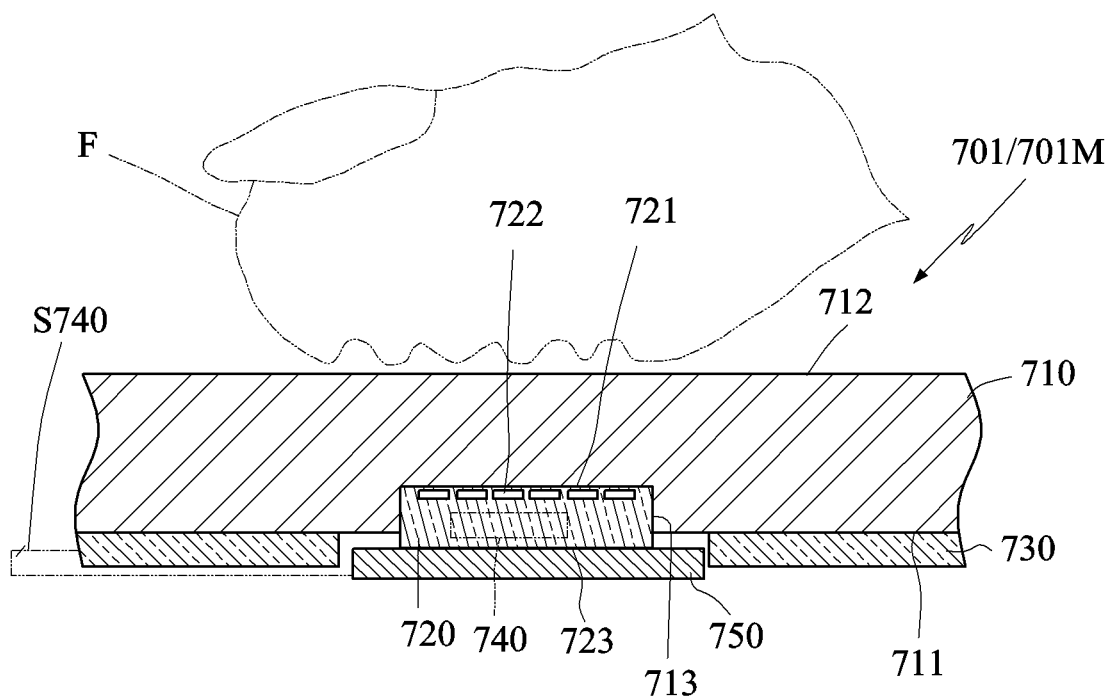
FIGS. 12A and 12B are partially cross-sectional views showing two examples of an electronic apparatus according to a second embodiment of the invention.
Figure 12B:
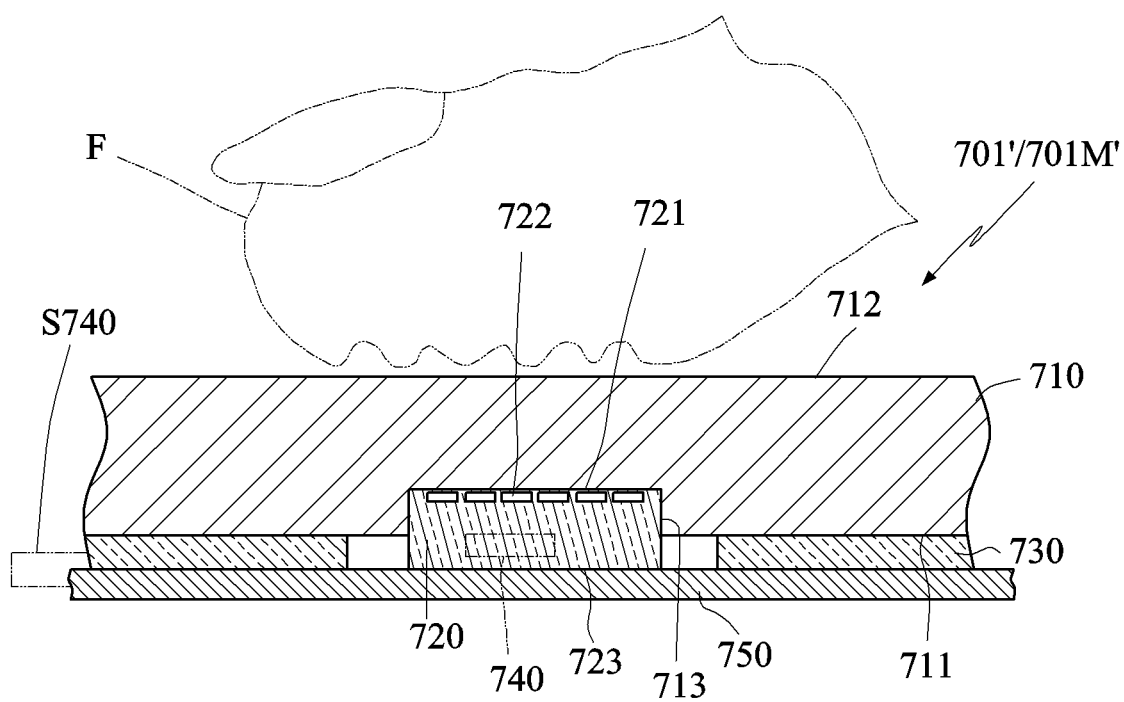

FIGS. 12A and 12B are partially cross-sectional views showing two examples of an electronic apparatus 701 according to a second embodiment of the invention. In FIG. 12A, the structure is similar to the first embodiment except that the housing 710 has a concave portion 713 formed on the first surface 711, and that the biometrics sensor 720 is embedded into the concave portion 713. Consequently, the distance from the biometrics sensor 720 and the object F can be further shortened, and the sensing effect and stability can be thus enhanced.

As shown in FIG. 12B, an electronic apparatus 701' is similar to the electronic apparatus 701 except that the non-sensing surface 723 of the biometrics sensor 720 disposed opposite the sensing surface 721 is mounted on and electrically connected to the flexible circuit board 750, wherein the coupling electrode 730 is disposed between the flexible circuit board 750 and the housing 710. Consequently, the biometrics sensor 720 may be mounted on the housing 710 more firmly through the flexible circuit board 750. In this embodiment, the coupling electrode 730 may be configured as a portion of a metal layer, which is exposed from a flexible circuit board and directly attached to the first surface 711.

Figure 13:
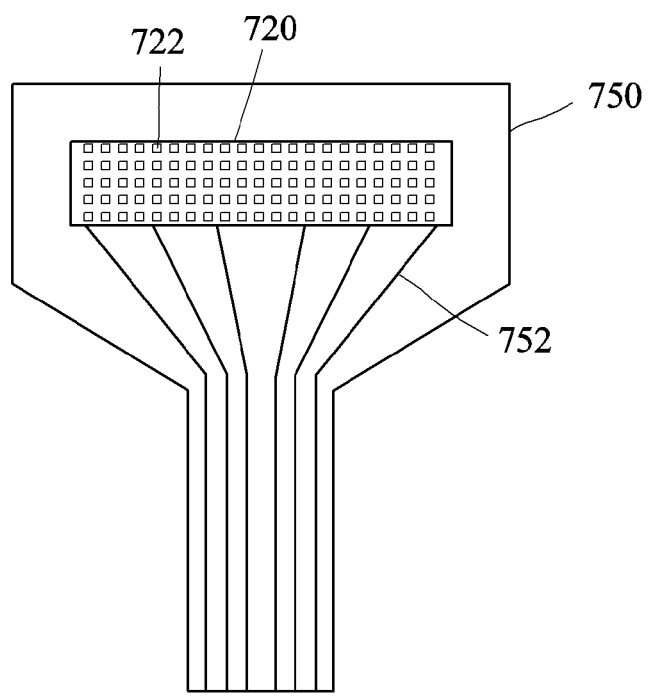
FIGS. 13 and 14 are top views showing two examples of combinations of biometrics sensors and flexible circuit boards according to the invention.
Figure 14:
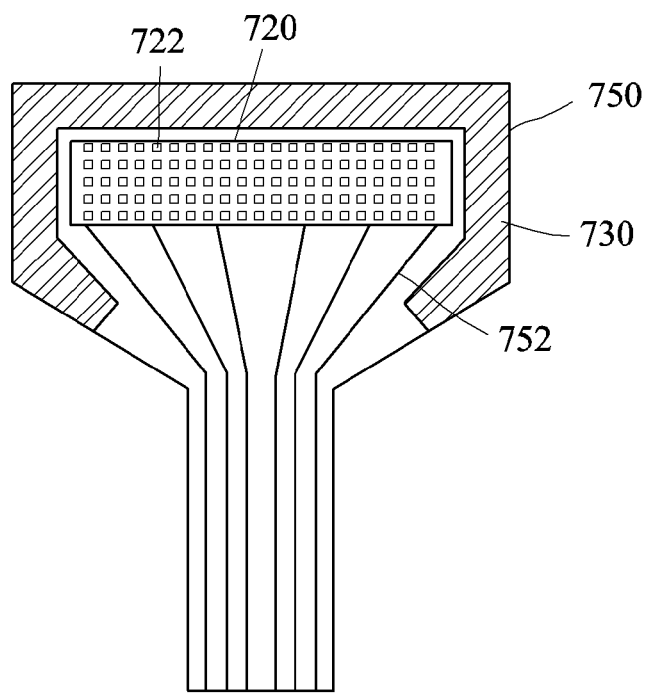

FIGS. 13 and 14 are top views showing two examples of combinations of biometrics sensors and flexible circuit boards according to the invention. In FIG. 13, the biometrics sensor 720 having the sensing members 722 arranged in the two-dimensional array is mounted on the flexible circuit board 750 using an adhesive, for example, and is electrically connected to traces 752 on the flexible circuit board 750. It is to be noted that the biometrics sensor may be firstly packaged and then adhered to the flexible circuit board by way of surface mount technology (SMT); or the biometrics sensor may be connected to the pads on the flexible circuit board by way of wire bonding. The structure of FIG. 14 is similar to that of FIG. 13 except that the coupling electrode 730 is formed on the flexible circuit board 750. Thus, applying the structure of FIG. 14 to that of FIG. 12B can adhere the coupling electrode 730 to the first surface 711 of the housing 710. Consequently, the structure of FIG. 14 may be manufactured and sold as a module and may be used directly.

Figure 15:
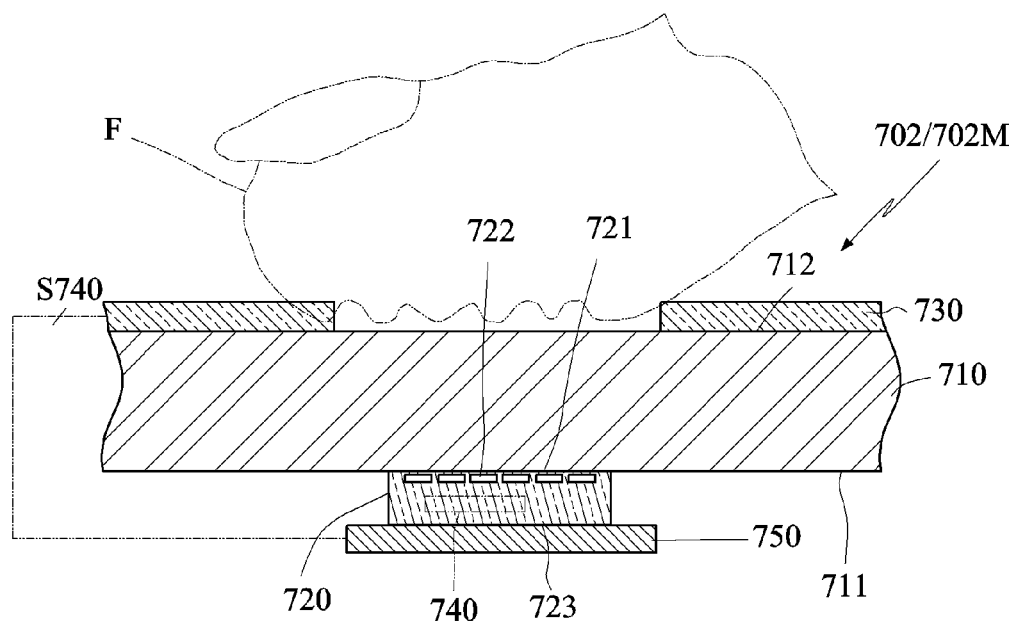
FIGS. 15 and 16 are partially cross-sectional views showing electronic apparatuses according to third and fourth embodiments of the invention.

FIGS. 15 and 16 are partially cross-sectional views showing electronic apparatuses according to third and fourth embodiments of the invention. As shown in FIG. 15, an electronic apparatus 702 of the third embodiment is similar to that of the first embodiment except that the coupling electrode 730 is disposed on the second surface 712 of the housing 710, and that the object F is directly coupled to the coupling electrode 730. The flexible circuit board 750 may also be electrically connected to the coupling electrode 730 according to the requirement. As shown in FIG. 16, an electronic apparatus 703 of the fourth embodiment is similar to that of the third embodiment except that the biometrics sensor 720 is embedded into the concave portion 713 to shorten the distance from the object F to the biometrics sensor 720, and that the drive circuit 740 of FIG. 16 is an external drive circuit disposed outside the biometrics sensor 720.

FIGS. 17A to 17D are partially cross-sectional views showing touch displays of electronic apparatuses according to fifth to ninth embodiments of the invention. As shown in FIG. 17A, a touch display 790 is composed of a touch panel structure 790A and a display 790B. The touch panel structure 790A includes the housing 710 and touch electrodes 715. The touch panel structure pertains to the prior art, so only a portion of the structure descriptions associated with the invention is illustrated herein. The housing 710 of this embodiment is an upper layer of the touch panel structure 790A of the touch display 790. Multiple touch electrodes 715 and coupling electrodes 730 are formed on the first surface 711 of the housing 710. The display 790B includes, from bottom to top, a lower glass substrate 790B1, a liquid crystal molecule layer 790B2, a color filter layer 790B3 and an upper glass substrate 790B1. Of course, such a display structure is only one of the prior art structures, and other display structures, such as an organic light emitting diode (OLED) display structure and the like, may also be applied to the invention. The touch display 790 may replace the display 760 of FIG. 1. This display is referred to as an on-cell touch display. The significant feature of this embodiment is that the coupling electrodes 730 and the electrodes of the touch panel are formed using, for example, an indium tin oxide (ITO) material, so that the cost can be saved.

In FIG. 17B, a touch display 791 is an in-cell touch display, which includes a thin film transistor (TFT) glass substrate 719, a color filter (CF) glass substrate 710 and liquid crystal molecules (not shown) disposed between the TFT glass substrate 719 and the CF glass substrate 710. Because the CF glass substrate 710 is in direct contact with the finger, it may also be regarded as the housing 710. Thus, the housing 710 is the upper layer of the touch display 791, and multiple touch electrodes 715 of the touch display 790 are formed on the first surface 711 of the housing 710. That is, the display 790 has an upper layer 710 and the lower layer 719, and display molecules, such as liquid crystal molecules, for displaying patterns. Herein, the upper layer 710 contains the indispensable elements for achieving the displaying function. Because this in-cell touch display is well known in the art, detailed structures thereof will be omitted. Of course, other display structures, such as OLED display structures and the like, may also be applied to the invention.

A touch display 792 of FIG. 17C is similar to the touch display 790 of FIG. 17A except that the coupling electrode 730 of the touch display 792 is disposed on the second surface 712, so the coupling electrode 730 provides the direct coupling effect for the finger. The other details have been mentioned hereinabove, and will be thus omitted herein.

A touch display 793 of FIG. 17D is similar to the touch display 791 of FIG. 17B except that the coupling electrode 730 of the touch display 793 is disposed on the second surface 712, so the coupling electrode 730 provides the direct coupling effect for the finger. The other details have been mentioned hereinabove, and will be thus omitted herein.

FIGS. 18A to 18D are partially cross-sectional views showing touch displays of electronic apparatuses according to tenth to thirteenth embodiments of the invention.

As shown in FIG. 18A, the seventh embodiment is similar to the fifth embodiment except that the sensing electrode 10 (as shown in FIG. 4) is completely separated from the sensing circuit in the biometrics sensor module of the seventh embodiment, wherein the sensing electrodes 722 and the electrodes 715 of the touch panel are manufactured concurrently. The differences between the sensing electrodes 722 and the electrodes 715 are described in the following. In order to perform the fingerprint sensing, the resolution has to be higher than or equal to 300 DPI, while the resolution for the touch electrodes is about only 5 DPI. In addition, a touch display 794 of this embodiment further includes a sensing circuit chip 720B. The touch electrodes 715 and the sensing members (sensing electrodes) 722 are formed concurrently and made of the same material. The sensing electrodes 722 and the touch electrodes 715 are electrically connected to the sensing circuit chip 720B. The dimension and the pitch of the touch electrodes 715 are greater than those of the sensing members 722. The sensing circuit chip 720B provides the coupling signal S740 to the coupling electrode 730. That is, the biometrics sensor is divided into two portions, one of which is a sensing member portion 720A, and the other of which is the sensing circuit chip 720B. The sensing members 722 of the sensing member portion 720A and the touch electrode 715 are made of the same material in the same manufacturing process, so that a lot of manufacturing costs can be saved. Furthermore, the sensing circuit chip 720B of the invention may further be integrated with other ICs, such as a driver IC of the display. Meanwhile, the sensing chip of the invention works according to the sensing principle similar to that of the touch panel, so the sensing chip and the driver IC of the touch panel may be integrated into a single chip, the sensing chip and the driver IC of the display may be integrated into another single chip, or the sensing chip and the driver ICs of the display and the touch panel may be integrated into still another single chip.

As shown in FIG. 18B, a touch display 795 of the eighth embodiment is similar to that of the seventh and sixth embodiments, and may be regarded as the combination of the seventh and sixth embodiments. Since those skill in the art may easily understood the implemented features according to FIG. 18B, detailed descriptions thereof will be omitted.

A touch display 796 of FIG. 18C is similar to the touch display 794 of FIG. 18A except that the coupling electrode 730 of the touch display 796 is disposed on the second surface 712, so the coupling electrode 730 provides the direct coupling effect for the finger. The other details have been mentioned hereinabove, so detailed descriptions thereof will be omitted.

A touch display 797 of FIG. 18D is similar to the touch display 795 of FIG. 18B except that the coupling electrode 730 of the touch display 797 is disposed on the second surface 712. So, the coupling electrode 730 provides the direct coupling effect for the finger. The other details have been mentioned hereinabove, so detailed descriptions thereof will be omitted.

It is to be noted that the housing 710 in each of FIGS. 17A to 18D is not restricted to a single-layer structure. In one example, the housing 710 may be a combination of a transparent substrate and a protection film, a combination of a transparent substrate and a polarizer, a combination of a transparent substrate and any other functional layer, or the like. Because the added protection film, polarizer or functional layer pertains to an insulating layer, which cannot affect the capacitor sensing. Furthermore, the transparent substrate such as a glass substrate is getting thinner and thinner, so the capacitive sensitivity becomes higher and higher. Therefore, the invention does not intend to restrict the housing 710 to any particular structure. Meanwhile, as shown in FIGS. 17A to 18D, the sensing electrode 722 and the coupling electrode 730 are separated from the touch electrode 715 in the geometric region. However, in another embodiment of the invention, as shown in FIG. 18E, the two sensing regions may overlap with each other. That is, high-density (corresponding to the resolution greater than 300 DPI) sensing electrodes are disposed in the touch screen region to perform the touch function (only the sensing electrodes corresponding to the resolution of 5 DPI are triggered or enabled) as well as the fingerprint sensing function. Thus, in this example, the 13*13 array composed of the sensing electrodes 722 of a touch display 798 can perform the fingerprint sensing function, while the 6*6 sensing electrodes 722 can constitute a touch electrode 715', wherein the touch function can be performed using the 6*6 sensing electrodes 722 as the touch electrodes 715'. The other touch electrodes 15 are left unchanged because they only need to implement the touch function. However, the numbers and dimensions of the sensing electrodes 722 and the touch electrodes are not restricted to those shown in the drawings. In general, the number of the sensing electrodes 722 in the array has to be greater than or equal to 100*100, the pitch between the touch electrodes is about 5 to 6 mm, and the pitch between the fingerprint sensing electrodes 722 is at least 50 to 80 um.

Figure 19:
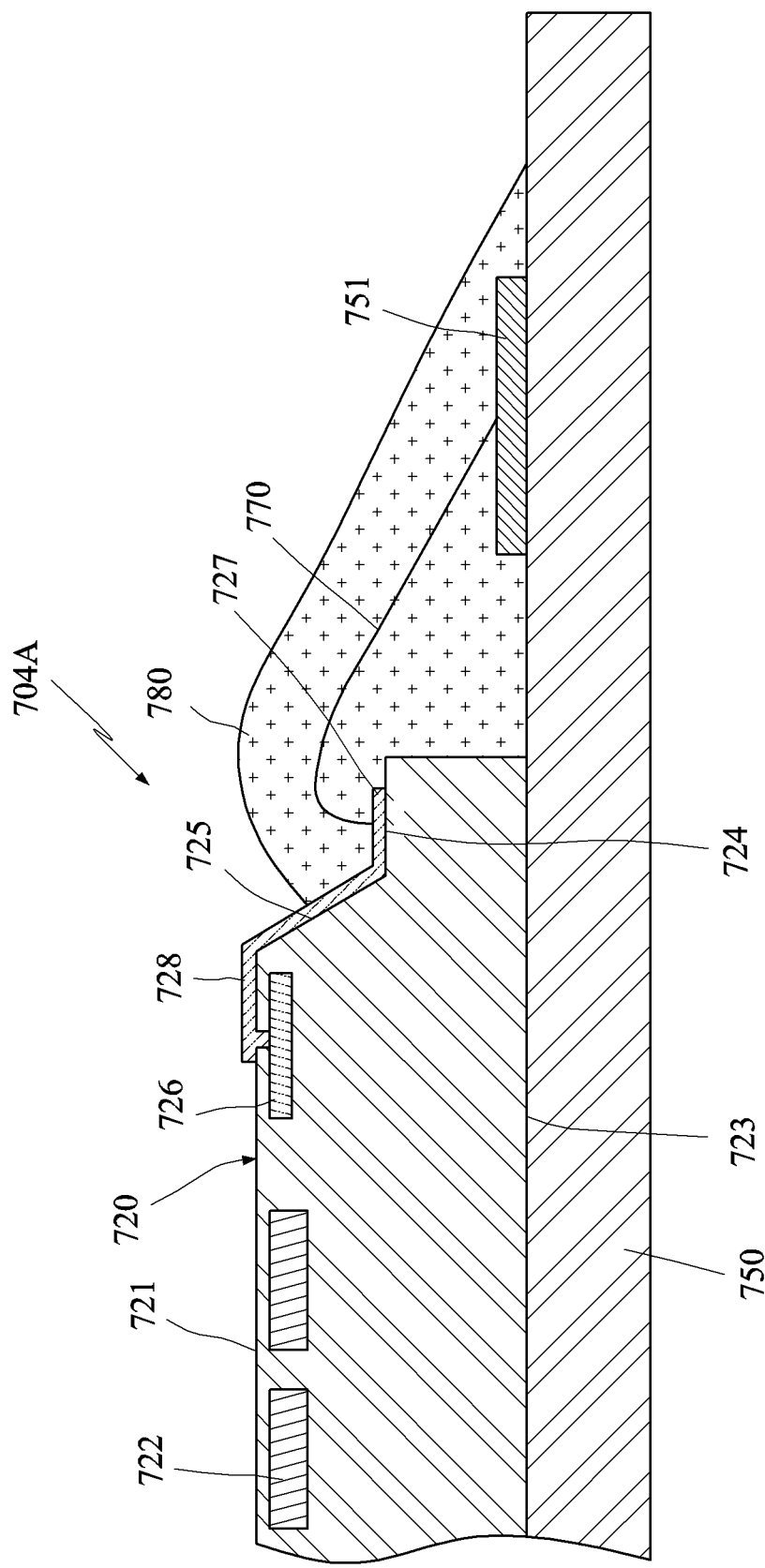
FIG. 19 is a partially cross-sectional view showing a biometrics sensor assembly according to the invention.

FIG. 19 is a partially cross-sectional view showing a biometrics sensor assembly 704A according to the invention, in which a sensing surface, can be in plane contact with the surface of the housing 710 (see also FIGS. 11B, 12A, 12B and 15-18D). If the designed plane contact is removed, as shown in the conventional package of FIG. 1, a redundant thickness of the sensor is present so that the sensitivity is significantly decreased. After the biometrics sensor assembly is combined with a portion of the housing, a biometrics sensor module can be formed. As shown in FIG. 19, the biometrics sensor assembly 704A includes the flexible circuit board 750, the biometrics sensor 720, wires 770 and an encapsulating layer 780. The biometrics sensor 720 includes the sensing surface 721 and the non-sensing surface 723, and further includes a depressed surface 724, a side surface 725, connection pads 726, bonding pads 727 and connection traces 728. A protection layer (not shown) for protecting the sensing surface 721 from the interference, such as moisture, dirt and the like, may further be formed on the sensing surface 721. In FIG. 19, the biometrics sensor 720 has a flat surface, and only has the protection material formed during the original semiconductor manufacturing process. The biometrics sensor 720 may be firstly adhered to the flexible circuit board 750 by an adhesive, and then the wire bonding process may be performed.

The depressed surface 724 is disposed between the sensing surface 721 and the non-sensing surface 723. The side surface 725 connects the sensing surface 721 to the depressed surface 724. The connection pad 726 is disposed on the sensing surface 721. The bonding pads 727 are disposed on the depressed surface 724. The connection traces 728 connects the connection pads 726 to the bonding pads 727, respectively. In this example, the bonding pads 727 are connected to the connection traces 728 using the conventional semiconductor manufacturing processes, which are well known in the art and will not be described herein. However, the invention is not particularly restricted thereto because the bonding pad 727 and the connection trace 728 may also be independent structures. The wires 770 are bonded to the bonding pads 727 and the connection portions 751 of the flexible circuit board 750, respectively. The encapsulating layer 780 covers the wires 770, the biometrics sensor 720 and the flexible circuit board 750.

A method of manufacturing the biometrics sensor of the invention will be described in the following example. FIGS. 20A to 20G are schematic illustrations showing structures in various steps of a method of manufacturing the biometrics sensor of the invention.

Figure 20A:
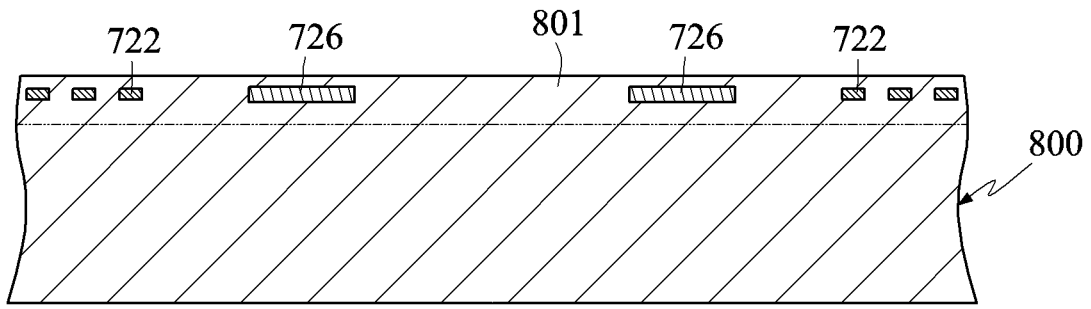
FIGS. 20A to 20G are schematic illustrations showing structures in various steps of a method of manufacturing the biometrics sensor of the invention.

First, as shown in FIG. 20A, a circuit element region 801 having sensing members 722 and connection pads 726 is formed on a silicon substrate 800. A protection layer may cover over the circuit element region 801 and will not be particularly illustrated herein.

Figure 20B:
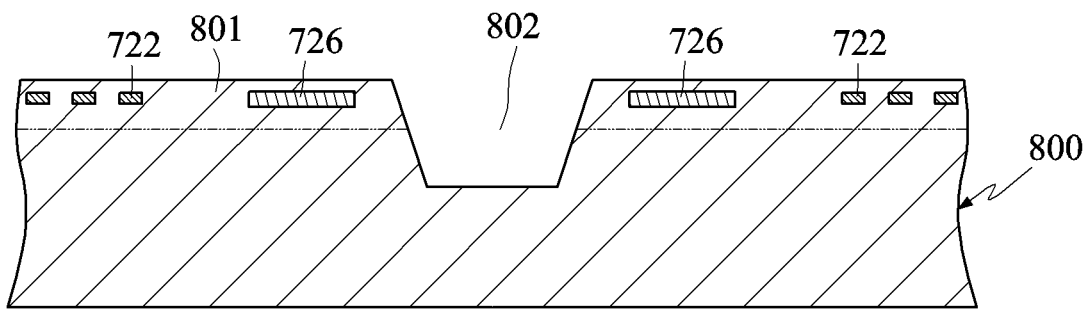

Then, as shown in FIG. 20B, a groove 802 is formed on the substrate 800 by way of, for example, dry etching, silicon anisotropic etching or cutting.

Figure 20C:
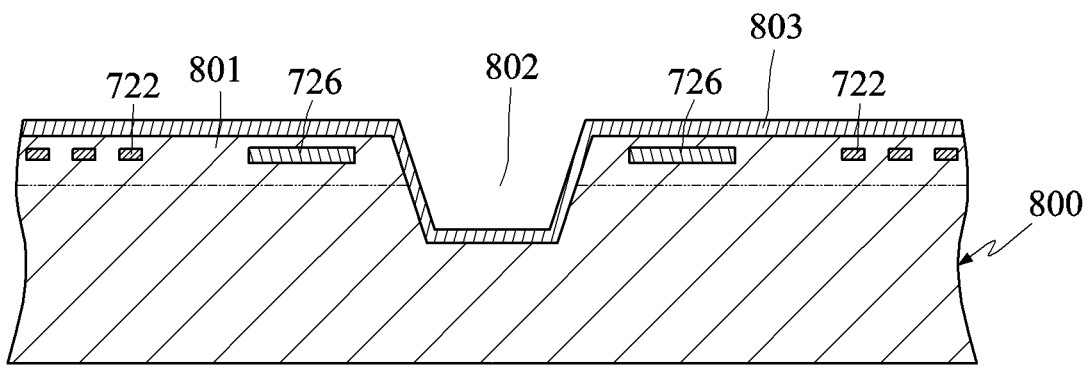

Next, as shown in FIG. 20C, an insulation protection layer 803 covers over the circuit element region 801 of the substrate 800 and the groove 802.

Figure 20D:
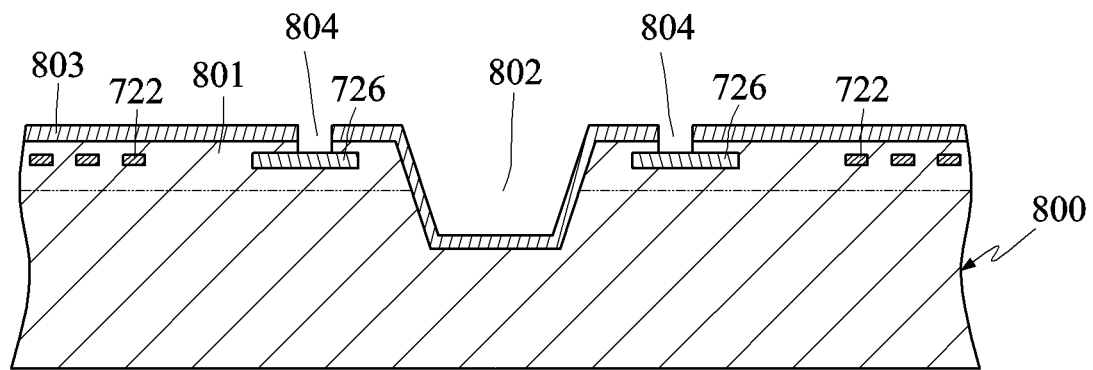

Then, as shown in FIG. 20D, multiple windows 804 are formed and defined on the insulation protection layer 803 above the connection pad 726.

Figure 20E:
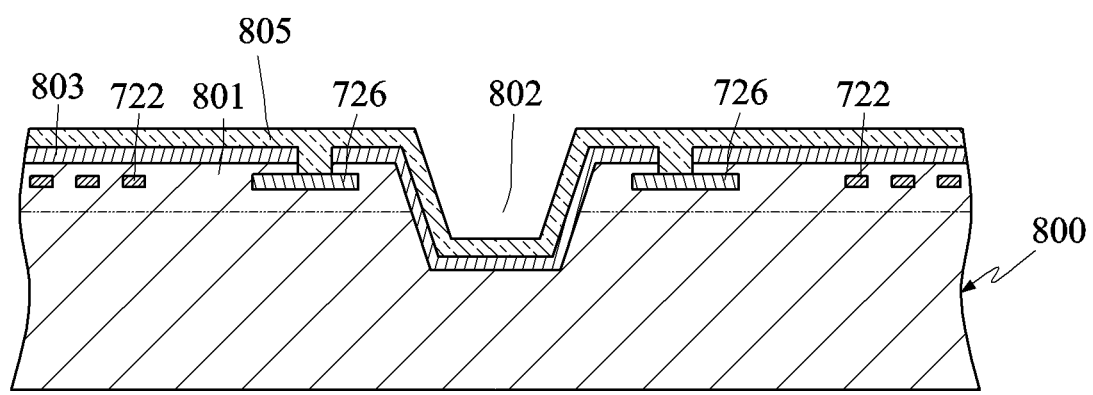

Next, as shown in FIG. 20E, a metal layer 805, which fills the windows 804 concurrently and is thus electrically connected to the connection pad 726, is formed on the insulation protection layer 803.

Figure 20F:
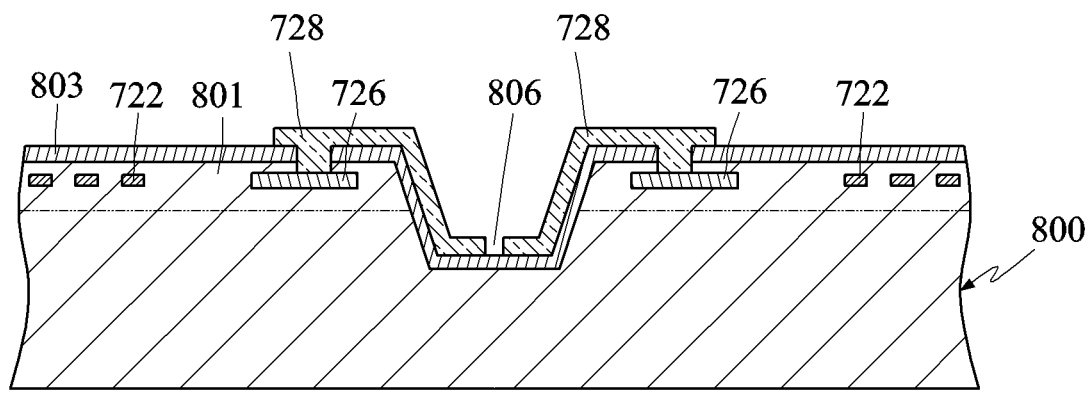

Then, as shown in FIG. 20F, the metal layer 805 is patterned to form grooves 806 and connection traces 728.

Figure 20G:
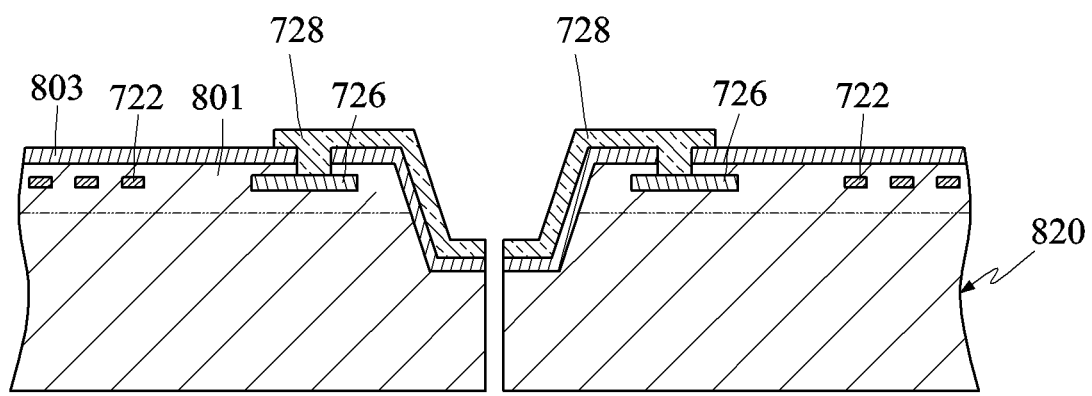

Next, as shown in FIG. 20G, cutting is performed along the grooves 806 to form multiple independent sensing chips 820. The structure of the biometrics sensor assembly 704A, as shown in FIG. 19, may be formed after each sensing chip 820 is wire-bonded and packaged.

According to the embodiments of the invention, it is possible to implement the active and hidden sensor with the high sensitivity and to apply the sensor to the electronic apparatus to provide the beauty exterior and to effectively prevent the dirt from being left in the interface between the sensor and the housing of the electronic apparatus.

While the present invention has been described by way of examples and in terms of preferred embodiments, it is to be understood that the present invention is not limited thereto. To the contrary, it is intended to cover various modifications. Therefore, the scope of the appended claims should be accorded the broadest interpretation so as to encompass all such modifications.

What is claimed is:

1. A biometrics sensor module, comprising:
a housing having a first surface and a second surface opposite to the first surface;
a biometrics sensor having a sensing surface disposed on the first surface of the housing, wherein the sensing surface has sensing members arranged in an array; and
a coupling electrode disposed on the first surface or the second surface of the housing, wherein:
two regions, projected from the sensing surface and the coupling electrode to the second surface of the housing, do not overlap with each other; and
a coupling signal is provided to the coupling electrode and directly or indirectly coupled to an object, so that the sensing members of the biometrics sensor sense biometrics messages of the object directly contacting with the second surface of the housing.

2. The biometrics sensor module according to claim 1, further comprising:
a flexible circuit board, electrically connected to the biometrics sensor and the coupling electrode, wherein a non-sensing surface of the biometrics sensor, which is disposed opposite the sensing surface and has no sensing function, is mounted on the flexible circuit board.

3. The biometrics sensor module according to claim 2, wherein the biometrics sensor further comprises:
a depressed surface disposed between the sensing surface and the non-sensing surface;
a side surface connecting the sensing surface to the depressed surface;
connection pads disposed on the sensing surface;
bonding pads disposed on the depressed surface; and
connection traces connecting the connection pads to the bonding pads, respectively.

4. The biometrics sensor module according to claim 3, further comprising:
wires bonded to the bonding pads and connection portions of the flexible circuit board, respectively; and
an encapsulating layer covering over the wires, the biometrics sensor and the flexible circuit board.

5. The biometrics sensor module according to claim 1, wherein the housing has a concave portion formed on the first surface, and the biometrics sensor is embedded into the concave portion.

6. The biometrics sensor module according to claim 1, wherein the coupling electrode is disposed on the second surface of the housing, and the object is directly coupled to the coupling electrode.

7. The biometrics sensor module according to claim 1, wherein the coupling electrode is disposed on the first surface of the housing, and the object is indirectly coupled to the coupling electrode.

8. The biometrics sensor module according to claim 7, further comprising:
a flexible circuit board electrically connected to the biometrics sensor and the coupling electrode, wherein a non-sensing surface of the biometrics sensor disposed opposite the sensing surface is mounted on and electrically connected to the flexible circuit board, and the coupling electrode is disposed between the flexible circuit board and the housing.

9. The biometrics sensor module according to claim 8, wherein the coupling electrode is formed on the flexible circuit board and adhered to the first surface of the housing.

10. The biometrics sensor module according to claim 7, wherein the housing is an upper layer of a touch display, and multiple touch electrodes and the coupling electrode are formed on the first surface of the housing.

11. The biometrics sensor module according to claim 10, further comprising a sensing circuit chip, wherein the touch electrodes and the sensing members have the same material and are formed concurrently, dimensions and pitches of the touch electrodes are greater than dimensions and pitches of the sensing members, the touch electrodes and the sensing members are electrically connected to the sensing circuit chip, and the sensing circuit chip provides the coupling signal to the coupling electrode.

12. The biometrics sensor module according to claim 7, wherein the housing is an upper layer of a touch display, and multiple touch electrodes of the touch display are formed on the first surface of the housing.

13. The biometrics sensor module according to claim 12, further comprising a sensing circuit chip, wherein the touch electrodes and the sensing members have the same material and are formed concurrently, dimensions and pitches of the touch electrodes are greater than dimensions and pitches of the sensing members, the touch electrodes and the sensing members are electrically connected to the sensing circuit chip, and the sensing circuit chip provides the coupling signal to the sensing members and provides a drive signal to drive the touch display to operate.

14. The biometrics sensor module according to claim 1, wherein the coupling signal is provided from the biometrics sensor to the coupling electrode.

15. The biometrics sensor module according to claim 1, further comprising a drive circuit, which is coupled to the coupling electrode and provides the coupling signal to the coupling electrode.

16. An electronic apparatus, comprising:
the biometrics sensor module according to claim 1;
a display, which is mounted on the housing and is for displaying images or information to interact with a user; and
a processor, which is disposed in the housing and electrically connected to the biometrics sensor and the display, and controls the biometrics sensor and the display to operate.

17. A biometrics sensor assembly, comprising:
a flexible circuit board;
a biometrics sensor, comprising:
a sensing surface having sensing members, which are arranged in an array and for sensing biometrics messages;
a non-sensing surface disposed opposite the sensing surface and disposed on the flexible circuit board;
a depressed surface disposed between the sensing surface and the non-sensing surface;
a side surface connecting the sensing surface to the depressed surface;
connection pads disposed on the sensing surface;
bonding pads disposed on the depressed surface; and
connection traces connecting the connection pads to the bonding pads, respectively;
bonding wires bonded to the bonding pads and connection portions of the flexible circuit board; and
an encapsulating layer covering over the bonding wires, the biometrics sensor and the flexible circuit board.

18. A method of manufacturing a biometrics sensor assembly, comprising the steps of:
forming a circuit element region on a silicon substrate, the circuit element region having sensing members and connection pads;
forming a first groove on the silicon substrate;
covering an insulation protection layer over the circuit element region of the silicon substrate and the first groove;
forming windows on the insulation protection layer above the connection pads;
forming a metal layer on the insulation protection layer, the metal layer filling the windows and being electrically connected to the connection pads;
patterning the metal layer to form a second groove and connection traces;
cutting along the second groove to form multiple independent sensing chips; and
performing wire-bonding and package procedures on one of the sensing chips to form the biometrics sensor assembly.

* * * * *